(12) United States Patent
Koga et al.

(10) Patent No.: US 6,342,703 B1
(45) Date of Patent: Jan. 29, 2002

(54) EXPOSURE APPARATUS, EXPOSURE METHOD, AND DEVICE MANUFACTURING METHOD EMPLOYING THE EXPOSURE METHOD

(75) Inventors: Shinichiro Koga, Utsunomiya; Shigeyuki Uzawa, Naka-machi, both of (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/422,100

(22) Filed: Oct. 20, 1999

(30) Foreign Application Priority Data

Oct. 23, 1998 (JP) ............................................ 10-319876

(51) Int. Cl.$^7$ .............................................. G03B 27/42
(52) U.S. Cl. .......................... 250/548; 355/53; 356/401
(58) Field of Search ................... 250/548; 355/53–55; 356/399–401

(56) References Cited

U.S. PATENT DOCUMENTS

| 5,142,156 A | | 8/1992 | Ozawa et al. ................ 250/548 |
| 5,416,562 A | * | 5/1995 | Ota et al. ..................... 355/53 |
| 5,499,099 A | | 3/1996 | Sato et al. .................... 356/400 |
| 5,521,036 A | * | 5/1996 | Iwamoto et al. .............. 430/22 |
| 5,543,921 A | | 8/1996 | Uzawa et al. ................. 356/401 |
| 5,585,925 A | | 12/1996 | Sato et al. .................... 356/401 |
| 5,695,897 A | | 12/1997 | Mitome et al. ................ 430/22 |
| 5,986,766 A | | 11/1999 | Koga et al. ................... 356/401 |
| 6,279,881 B1 | * | 8/2001 | Nishi ........................... 250/548 |
| 6,285,438 B1 | * | 9/2001 | Hazelton et al. .............. 355/53 |

FOREIGN PATENT DOCUMENTS

| JP | 7-120621 | 12/1995 |
| JP | 2516194 | 4/1996 |
| JP | 10-242048 | 9/1998 |

* cited by examiner

Primary Examiner—Stephone B. Allen
(74) Attorney, Agent, or Firm—Fitzpatrick, Cella, Harper & Scinto

(57) ABSTRACT

An exposure apparatus for exposing a substrate to transfer a pattern of an original mask to the substrate includes a detecting unit for detecting a position of a representative point within a representative area in the substrate, a determining unit for determining the positional deviation of each of a plurality of the representative areas from among a plurality of areas in the substrate, based on the detection by the detection unit, a statistical calculation unit for statistically calculating the positional deviation of each area in the substrate, based on the determined positional deviations of the representative areas, a calculating unit for calculating an in-area error in each area, based on the statistically calculated positional deviation of each area, and a correcting unit for correcting the position of the substrate in accordance with the calculated in-area error, to successively process the areas of the substrate.

20 Claims, 8 Drawing Sheets

EXPOSURE APPARATUS, EXPOSURE METHOD, AND DEVICE MANUFACTURING METHOD EMPLOYING THE EXPOSURE METHOD

BACKGROUND OF THE INVENTION

1. Field of the Invention

The present invention relates to an exposure apparatus, an exposure method and a device manufacturing method employing the exposure method, for use in the manufacture of semiconductor devices, liquid-crystal devices, etc. More particularly, the present invention relates to an exposure apparatus, an exposure method and a device manufacturing method employing the exposure method, for accurately aligning an original mask, such as a reticle, with a substrate, such as a semiconductor wafer or glass substrate, to achieve good exposure performance.

2. Description of the Related Art

As the miniaturization and degree of integration are currently promoted in the design of semiconductor integrated circuits, such as LSIs (Large-Scale Integrated Circuits), alignment accuracy requirements in integrated circuits have become rigorous. Semiconductor device manufacturing exposure apparatuses employ methods called a step-and-repeat method and a step-and-scan method to expose a single substrate being processed to a plurality of original masks. As an alignment method, a global alignment method disclosed in Japanese Examined Patent Publication No. 7-120621 is used. In this alignment method, position measurement information of alignment marks in a plurality of sample shot areas on the substrate is processed using a statistical technique to calculate the position of each shot area.

The inventors of this invention have learned that the overall position accuracy of the substrate is greatly affected not only by the position accuracy of each shot area, but also by error components, such as magnification, rotation and skew at each shot area (hereinafter referred to as "in-shot error components") as the accuracy level improves today. Non-linear deformation of the substrate and error introduced in film formation are considered to cause the in-shot error components.

Conventionally, the in-shot error components are not corrected, or, if corrected, the in-shot error components are treated as being a constant, regardless of the shot area position within the substrate.

SUMMARY OF THE INVENTION

It is a first object of the present invention to improve alignment accuracy by correcting an in-shot error component, which is an error component varying with a shot area position.

It is a second object of the present invention to provide a method that permits an in-shot error to be corrected, while performing alignment at a throughput at the same level as that achieved in the conventional method. In other words, the second object is to provide a method that works if at least one measurement is made in each of the X direction and the Y direction at each sample shot area, as in the conventional method.

To achieve the first object, an exposure apparatus of the present invention, in a first aspect, includes a detecting unit for detecting a position of a representative point within a representative area from among a plurality of areas in the substrate, to determine an in-area error in the representative area, a statistical calculation unit for statistically calculating the in-area error of each area in the substrate, based on the determined in-area errors of the representative areas, and a correcting unit for correcting the position of the substrate in accordance with the calculated in-area error, to successively process the areas of the substrate.

In a preferred embodiment, a plurality of representative points are set up in one representative area, the detecting unit includes a measuring unit for measuring the positional deviation in each of the plurality of representative points, and the in-area error of the representative area is determined based on the measured value of the positional deviation.

In a preferred embodiment, a plurality of representative areas are set up, and the statistical calculation unit determines the in-area error of each area in the substrate, based on the in-area error determined for each representative area.

In a preferred embodiment, at least three representative areas are set up in the substrate.

In a preferred embodiment, the in-area error includes at least one of a magnification component and a rotational component.

In a preferred embodiment, the exposure apparatus is of a step-and-repeat type, which stepwise moves a substrate stage holding the substrate thereon to set an area of the substrate to an exposure position before exposing the area of the substrate, and the correcting unit drives the substrate stage, an original mask stage holding the original mask thereon, or part of a projection lens unit during the stepwise movement to correct the in-area error of the area to be exposed.

In a preferred embodiment, the exposure apparatus is of a step-and-scan type, which stepwise moves a substrate stage holding the substrate thereon to set an area of the substrate to an exposure start position before exposing the substrate in a scanning exposure manner, and the correcting unit drives the substrate stage, an original mask stage holding the original mask thereon, or part of a projection lens unit during the stepwise movement or scanning exposure operation to correct the in-area error of the area to be exposed.

In a preferred embodiment, the in-area error includes a skew component.

In the first aspect of the present invention, an exposure method includes the steps of detecting a position of a representative point within a representative area from among a plurality of areas in the substrate, to determine an in-area error of the representative area, statistically calculating the in-area error of each area in the substrate, based on the measured in-area errors of the representative areas, and correcting the position of the substrate in accordance with the calculated in-area error, to successively process the areas of the substrate.

In the first aspect of the present invention, a device manufacturing method includes the steps of detecting a position of a representative point within a representative area from among a plurality of areas in the substrate, to determine an in-area error of the representative area, statistically calculating the in-area error of each area in the substrate, based on the determined in-area errors of the representative areas, and correcting the position of the substrate in accordance with the calculated in-area error, to successively process the areas of the substrate.

To achieve the second object, an exposure apparatus of the present invention, in a second aspect, includes a detecting unit for detecting a position of a representative point within a representative area in the substrate, a determining unit for determining the positional deviation of each of a plurality of the representative areas from among a plurality of areas in the substrate, based on the detection by the detection unit, a statistical calculation unit for statistically calculating the positional deviation of each area in the substrate, based on the determined positional deviations of the representative areas, a calculating unit for calculating an in-area error in each area, based on the statistically calculated positional deviation of each area, and a correcting unit for correcting the position of the substrate in accordance with the calculated in-area error, to successively process the areas of the substrate.

In a preferred embodiment, the statistical calculation unit calculates the positional deviation of each area in the substrate by employing an approximation equation of a second or higher degree.

In a preferred embodiment, the calculating unit calculates the in-area error, based on a rate of change in the positional deviation of each area.

In a preferred embodiment, the in-area error includes at least one of a magnification component and a rotational component.

In a preferred embodiment, the exposure apparatus is of a step-and-repeat type, which stepwise moves a substrate stage holding the substrate thereon to set an area of the substrate to an exposure position before exposing the area of the substrate, and the correcting unit drives the substrate stage, an original mask stage holding the original mask thereon, or part of a projection lens unit during the stepwise movement to correct the in-area error of the area to be exposed.

In a preferred embodiment, the exposure apparatus is of a step-and-scan type, which stepwise moves a substrate stage holding the substrate thereon to set an area of the substrate to an exposure start position before exposing the substrate in a scanning exposure manner, and the correcting unit drives the substrate stage, an original mask stage holding the original mask thereon, or part of a projection lens unit during the stepwise movement or scanning exposure operation, to correct the in-area error of the area to be exposed.

In a preferred embodiment, the in-area error includes a skew component.

In the second aspect of the present invention, an exposure method includes the steps of detecting a position of a representative point within a representative area in the substrate, determining the positional deviation of each of a plurality of the representative areas from among a plurality of areas in the substrate, based on the detection in the detecting step, statistically calculating the positional deviation of each area in the substrate, based on the determined positional deviations of the representative areas, calculating an in-area error in each area, based on the statistically calculated positional deviation of each area, and correcting the position of the substrate in accordance with the in-area error, to successively process the areas of the substrate.

In a preferred embodiment, the step of statistically calculating the positional deviation calculates the positional deviation of each area in the substrate employing an approximation equation of a second or higher degree.

In the second aspect of the present invention, a device manufacturing method includes the steps of detecting a position of a representative point within a representative area in the substrate, determining the positional deviation of each of a plurality of the representative areas from among a plurality of areas in the substrate, based on the detection in the detecting step, statistically calculating the positional deviation of each area in the substrate, based on the determined positional deviations of the representative areas, calculating an in-area error in each area, based on the statistically calculated positional deviation of each area, and correcting the position of the substrate in accordance with the in-area error, to successively process the areas of the substrate.

DESCRIPTION OF THE PREFERRED EMBODIMENTS

Figure 1:
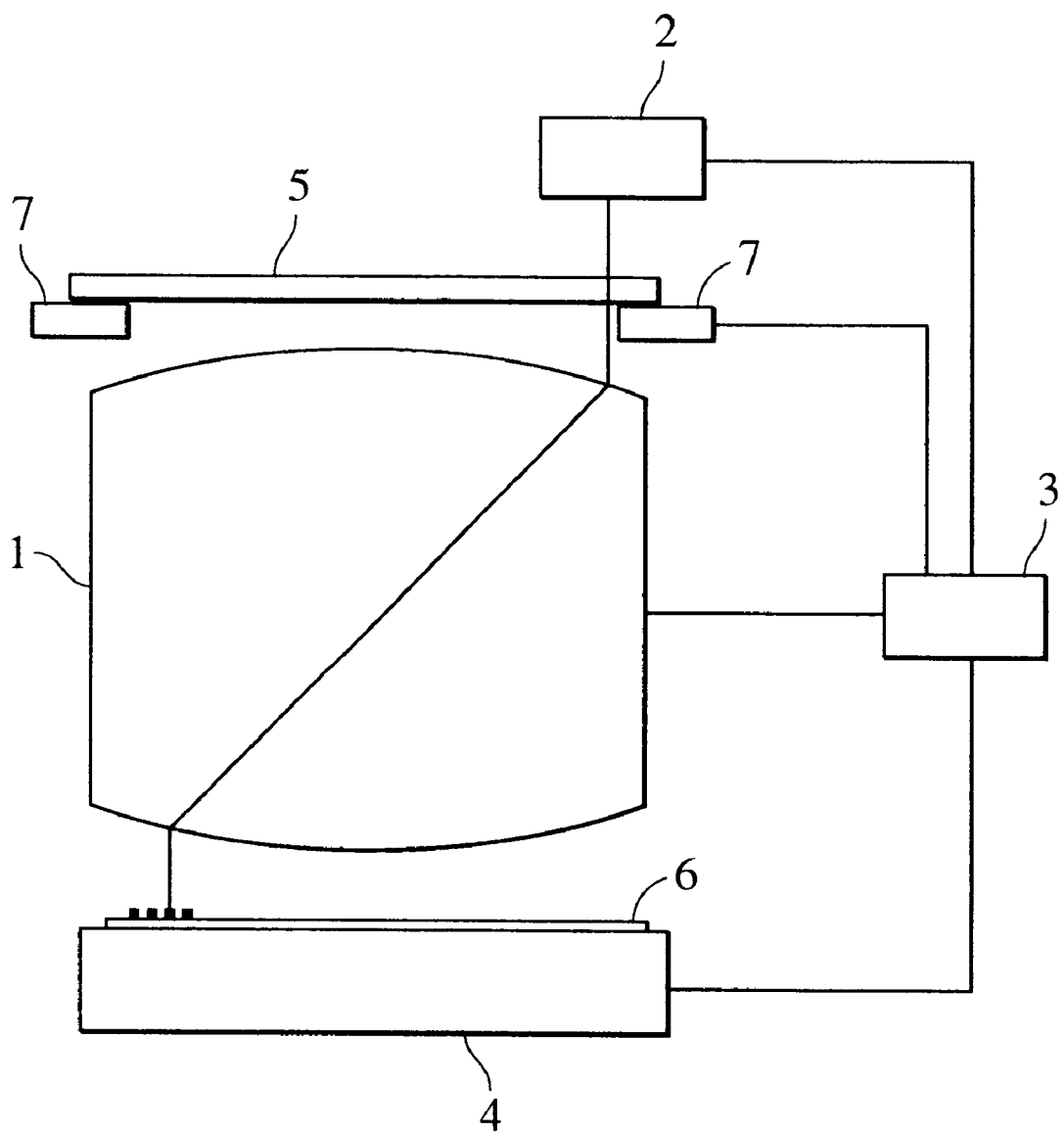
FIG. 1 shows a step-and-repeat exposure apparatus for manufacturing semiconductor devices in accordance with a first embodiment of the present invention.

In a first aspect of the present invention, a wafer alignment method, for an apparatus (stepper) which performs a full-wafer exposure after stepwise moving a wafer stage in the order of shot areas on a semiconductor wafer or an apparatus (scanner) that performs a scanning exposure subsequent to placing the wafer stage to a process start position, utilizes the following steps to process a plurality of shot areas on the semiconductor wafer:

(a) in-shot error components, such as errors in magnification, rotation and skew, of these sample shot areas, are determined by measuring a plurality of marks (representative points in representative areas) of pre-selected sample shot areas;

(b) based on calculated values of the in-shot error components of these sample shot areas, the in-shot error component in each shot area in the wafer is determined through a statistical calculation; and (c) when the wafer is stepwise moved by the wafer stage or is subjected to a scanning exposure to process each shot area on the wafer, the wafer stage, a reticle stage or part of a projection lens unit is driven in a corrective operation to correct the statistically calculated in-shot error component of the shot area to be exposed.

When in-shot error components are determined in the above first aspect of the present invention, positional errors of a plurality of points in the sample shot area are measured and the in-shot error component of the sample shot area is estimated from the measured value.

In a second aspect of the present invention, the in-shot error is estimated based on an assumption that the in-shot error of each shot area is equal to a rate of change in positional deviation of each shot area position. Specifically, an X-direction shot magnification correction is derived from a rate of change (i.e., a derivative) in an X-direction positional deviation with respect to the X direction, a Y-direction shot magnification correction is derived from a rate of change (i.e., a derivative) in a Y-direction positional deviation with respect to the Y direction, an X-direction amount of rotation is derived from a rate of change (i.e., a derivative) in an X-direction positional deviation with respect to the Y direction, and a Y-direction amount of rotation is derived from a rate of change (i.e., a derivative) in a Y-direction positional deviation with respect to the X direction.

In a conventional method, a positional deviation ($d'_x$, $d'_y$) at each shot area position (x, y) is derived from measured values (of positional deviation) of a sample shot area by performing an approximation calculation using the following first-degree correction equations:

$$d'_x = a_{00} + a_{10}x + a_{01}y \quad (1)$$

$$d'_y = b_{00} + b_{10}x + b_{01}y \quad (2)$$

where $a_{00}$ and $b_{00}$ respectively represent translations of the entire wafer in the X and Y directions, $a_{10}$ and $b_{10}$ respectively represent stretches (e.g., distortions in magnification) of the wafer in the X and Y directions, and $a_{01}$ and $b_{01}$ respectively represent rotations of a shot area arrangement with respect to the X and Y axes.

In this embodiment, to determine the rate of change in the positional deviation, a positional deviation ($d'_x$, $d'_y$) at each shot area position (x, y) is derived from measured values (of positional deviation) of a sample shot area by performing an approximation calculation using the following second or higher degree correction equation (for example, a third-degree equation as shown below):

$$d'_{xi} = a_{00} + a_{10}x_i + a_{01}y_i + a_{02}y_i^2 + a_{30}x_i^3 + a_{12}x_i y_i^2 \quad (3)$$

$$d'_{yi} = b_{00} + b_{10}x_i + b_{01}y_i + b_{20}x_i^2 + b_{21}x_i^2 y_i + b_{03}y_i^3 \quad (4)$$

whereas for correction parameters $a_{nm}$ and $b_{nm}$, $a_{00}$ is an X-direction translation component, $a_{10}$ is an X scale, $a_{01}$ is a rotation with respect to the Y axis, $a_{02}$ is a bow with respect to the Y axis, $a_{30}$ is a third degree magnification, $a_{12}$ is a third degree magnification, $b_{00}$ is a Y direction translation component, $b_{10}$ is a rotation with respect to the Y axis, $b_{01}$ is a Y scale, $b_{20}$ is a bow with respect to the X axis, $b_{21}$ is a third degree magnification, and $b_{03}$ is a third degree magnification. The in-shot error is thus calculated from the rate of change (a derivative in each shot area position) in the second or higher degree (for example, a third degree) equation.

According to a second aspect of the present invention, the alignment is carried out while the in-shot correction is performed at a throughput at the same level as that achieved in the conventional method, namely, in one measurement in each of the X direction and the Y direction at each sample shot area. The method of this aspect provides an alignment accuracy at the same level achieved by the sample in-shot error estimation and correction method in accordance with the first aspect of the present invention.

In a second aspect of the present invention, a wafer alignment method, for an apparatus (stepper) which performs a full-wafer exposure after stepwise moving a wafer stage in the order of shot areas on a semiconductor wafer or an apparatus (scanner) that performs a scanning exposure subsequent to placing the wafer stage to a process start position, takes the following steps to process a plurality of shot areas on the semiconductor wafer (i.e., a substrate):

(a) a positional deviation (i.e., a positional error) of a sample shot area (i.e., a representative area of each of a plurality shot areas) is determined by measuring a plurality of preselected wafer marks (namely, representative points in the representative area);

(b) the positional deviation of each shot area in the wafer is determined from the positional deviation of the sample shot area;

(c) in-shot error components (i.e., in-area errors), such as the error in magnification, rotation and skew of each shot area in the wafer, are estimated from the positional deviation of each shot area in the wafer; and (d) when the wafer is stepwise moved by the wafer stage or is subjected to the scanning exposure to process each shot area on the wafer, the wafer stage, a reticle stage (an original mask stage) or part of a projection lens unit is driven in a corrective operation to correct the positional deviation and the in-shot error component.

The positional deviation of each shot area in the wafer is preferably determined using an approximation equation of a second or higher degree.

The embodiments of the present invention are now discussed, referring to the drawings.

First Embodiment

FIG. 1 shows a first embodiment in which a second aspect of the present invention is implemented in a semiconductor device manufacturing step-and-repeat exposure apparatus.

Figure 3:
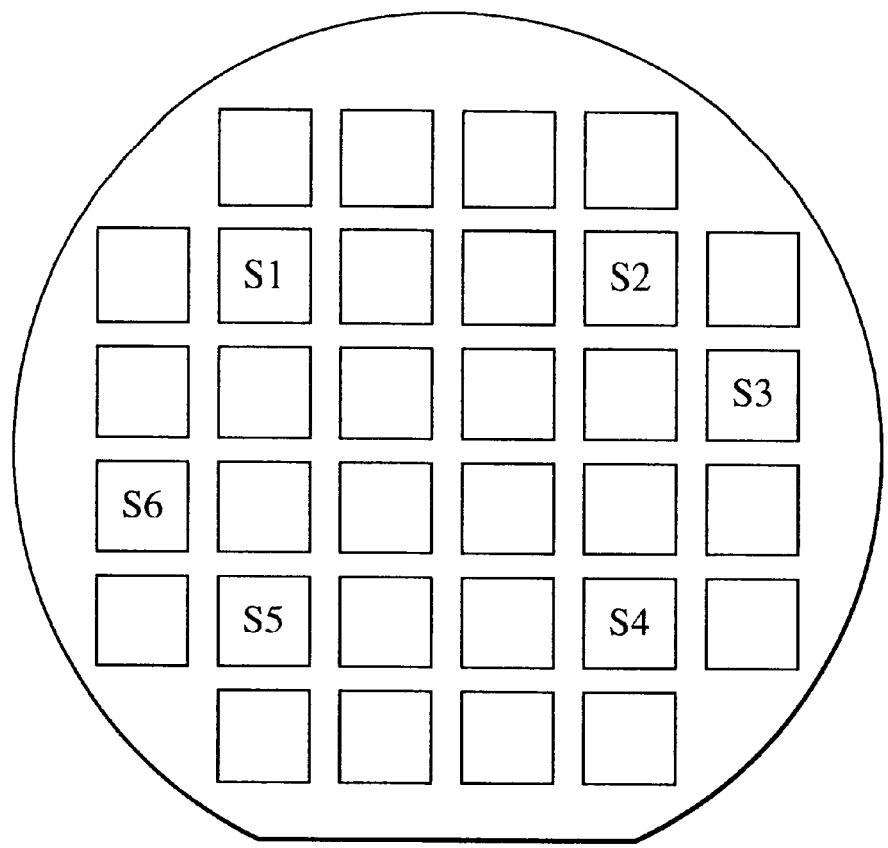
FIG. 3 shows an example of an exposure field and sample shot areas in a wafer.

As shown, the exposure apparatus includes a projection optical system 1, a mark position detector 2, a controller 3 for controlling the exposure apparatus, a two-dimensionally movable XY stage 4, a reticle (original mask) 5, a wafer (substrate) 6, and a reticle stage 7 which moves the reticle 5 by an infinitesimal distance. Although FIG. 1 shows only the X-direction mark position detector 2 for detecting a position in the X direction, the exposure apparatus also employs a Y-direction mark position detector (not shown) for detecting a position in the Y direction. The exposure apparatus for manufacturing semiconductor devices, as shown in FIG. 1, relatively aligns the reticle 5 and the wafer 6, projects exposure light from an illumination light source (not shown) onto the reticle 5, and exposes, in a step-and-repeat manner, the wafer 6, placed onto the XY stage 4, to an electrical circuit pattern formed in the reticle 5, through the projection optical system 1. FIG. 3 shows an exposure field and sample shot areas, and FIG. 4 shows alignment marks in each sample shot area.

Figure 2:
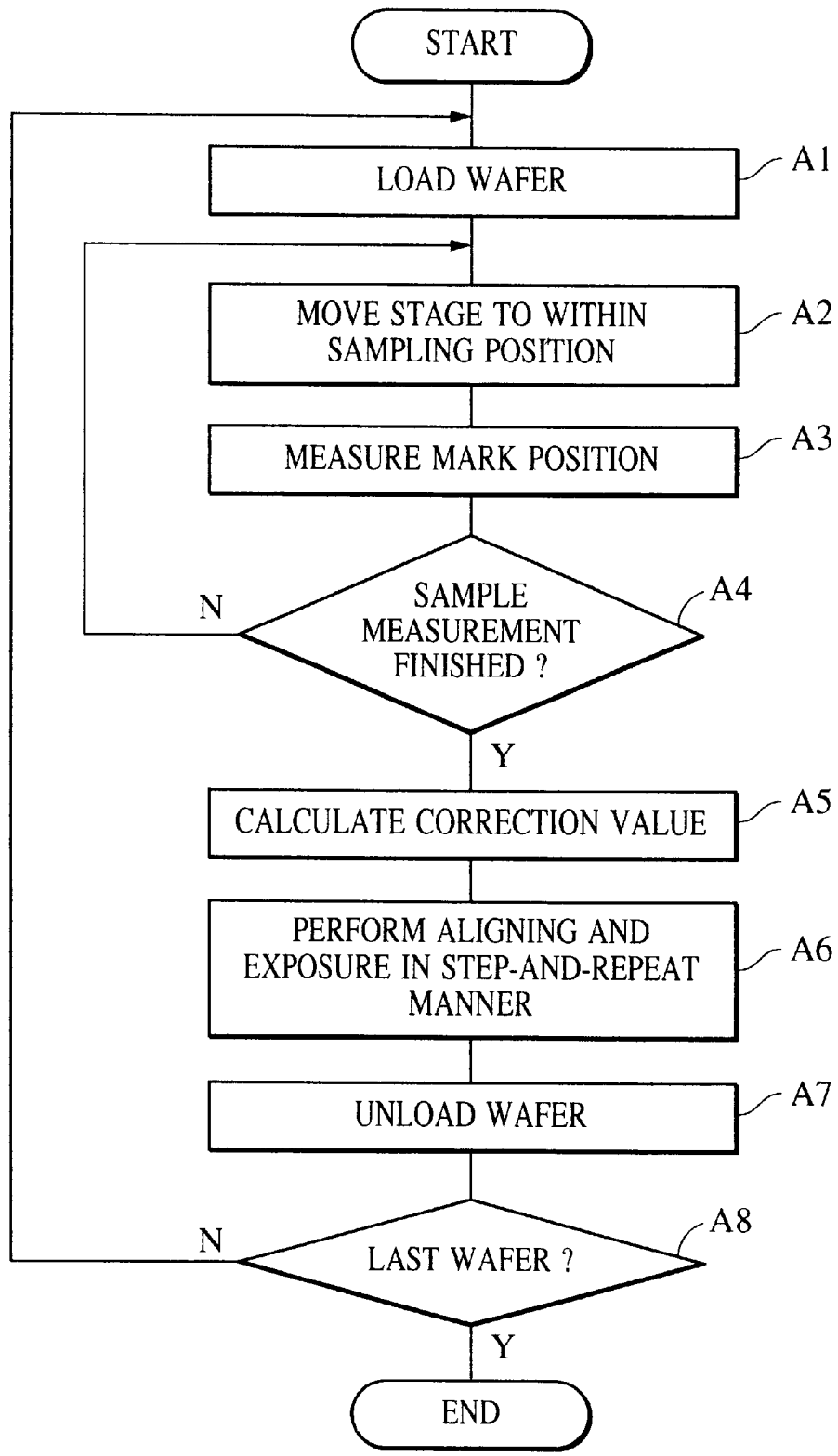
FIG. 2 is a flow diagram showing an alignment and exposure sequence used by the exposure apparatus of FIG. 1.

Now discussed is a procedure for the relative alignment between the reticle 5 and the wafer 6 and exposure of the wafer 6 using the exposure apparatus shown in FIG. 1. FIG. 2 is a flow diagram of the alignment and exposure sequence in which the present invention is implemented.

In step A1, a wafer transport mechanism (not shown) loads the wafer 6 onto the XY stage 4.

Figure 4:
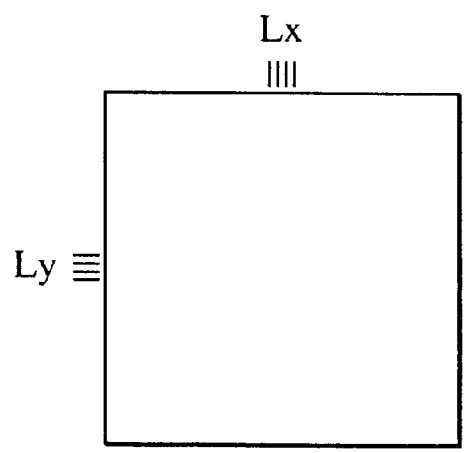
FIG. 4 shows alignment marks in a sample shot area.

In step A2, the controller 3 drives the XY stage 4 until an alignment mark $L_x$, shown in FIG. 4, formed in a first sample shot area S1, shown in FIG. 3, comes within a field of view of the mark position detector 2.

In step A3, the position of the mark $L_x$ is measured in the following sequence.

Figure 5:
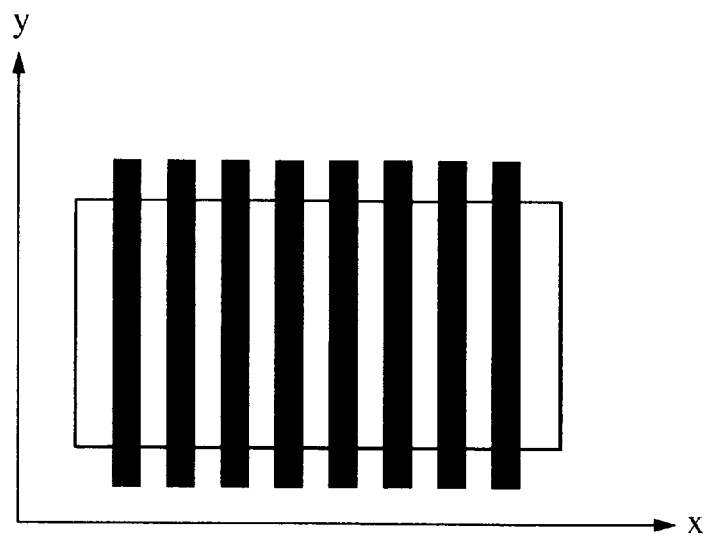
FIG. 5 shows an alignment mark.

An aligning illumination unit, in the mark position detector 2, for projecting non-exposure light, illuminates the alignment mark $L_x$ (also referred to as a wafer mark) through the projection optical system 1. FIG. 5 shows the wafer mark $L_x$, which is composed of a plurality of identical rectangles arranged side by side. A luminous flux, reflected off the wafer mark $L_x$, reaches the mark position detector 2 through the projection optical system 1. An image N of the wafer mark $L_x$ is formed on an image pickup device included in the mark position detector 2.

The image pickup device photoelectrically converts the image N of the wafer mark $L_x$ and an A/D converter converts the wafer image N into a digital signal F(x). Pattern matching is performed using a prestored template, and the center of the mark is measured and is output to the controller 3. The center of the mark is determined with respect to the plane of the image pickup device, and the controller 3 calculates the positional deviation $X_1$ of the wafer mark $L_x$ with respect to the reticle 5 in accordance with a method (not shown), based on the position of the reticle 5 relative to the image pickup device.

Similarly, the positional deviation $Y_1$ of the alignment mark $L_y$ (also shown in FIG. 4) is calculated.

Parameters regarding the positional deviation of each sample shot area are measured in one position in each of the X and Y directions and the positional deviation is then calculated. Measurements may be performed in a plurality of positions in each of the X and Y directions to determine the positional deviation in each shot area.

Step A2 and step A3 are repeated until a predetermined number of shot measurements is performed in step A4, and positional deviations in the shots $X_2 \ldots X_n$, $Y_2 \ldots Y_n$ are thus calculated.

In step A5, in-shot errors (i.e., a shot rotation and an error in shot magnification) and a shift (i.e., a positional deviation) of each shot are calculated from the positional deviation of the sample shot area measured at step A3 in accordance with the following sequence.

1. The magnification correction, rotation and shift of the entire wafer are calculated using approximate equations of a high degree with respect to a position on the wafer.
2. The magnification correction, rotation and shift of each shot area are calculated using the high-degree equations.

In step A6, each shot area is exposed in a step-and-repeat manner. Prior to exposure, the in-shot error components and the shift, calculated in step A5, are corrected using a combination of the following correction means to relatively align the wafer 6 and the reticle 5.

The correction means for correcting the in-shot error component and shift in the step-and-repeat type exposure apparatus are listed below.

1. The shift in each shot area is corrected by driving the XY stage 4.
2. Projection magnification correction means for driving a floating lens (not shown) in the projection optical system 1 corrects the shot magnification in each shot. For example, the method disclosed in Japanese Patent No. 2516194 may be employed as the projection magnification correction means.
3. Relative rotation correction means for rotating the reticle stage 7 relative to the XY stage 4 corrects the shot rotation in each shot area.
4. Distortion correction means, in the projection optical system 1, for driving an lens (not shown) corrects the shot rotation in each shot. A method for correcting distortion in driving the lens is disclosed in detail in Provisional Publication No. 10-242048.

In step A7, the unshown wafer transport mechanism unloads the wafer 6 from the XY stage 4.

Steps A1 through A7 are repeated until it is determined in step A8 that the last wafer has been processed.

Accordingly, the alignment and exposure process of the present invention has been discussed.

Discussed next is the method of calculating the in-shot errors (including the shot rotation and the shot magnification correction) and the shift (the positional deviation) of each shot area from the measurements of the sample shot areas. In the first embodiment, the magnification correction, rotation and shift of the entire wafer are calculated with respect to a position on the wafer using an approximate equation of a high degree, in order to approximate the magnification correction, rotation and shift at each shot area.

Derived from the measurements of the sample shot areas are the magnification correction, rotation and shift of the entire wafer, namely, an X-direction shift $a_{00}$, an X-axis first-degree magnification correction $a_{10}$, a rotation with respect to the Y axis $a_{01}$, a bow relative to the Y axis $a_{02}$, third degree magnifications $a_{30}$ and $a_{12}$, a Y direction shift $b_{00}$, a rotation with respect to the Y axis $b_{10}$, a Y-axis first-degree magnification correction $b_{01}$, a bow relative to the X axis $b_{20}$, and third-degree magnifications $b_{21}$ and $b_{03}$. Let X and Y represent the shifts (positional deviations) in the X and Y directions at the center (x, y) of the shot area and the following equations hold.

$$X(x, y) = a_{00} + a_{10}x + a_{01}y + a_{02}y^2 + a_{30}x^3 + a_{12}xy^2 \tag{5}$$

$$Y(x, y) = b_{00} + b_{10}x + b_{01}y + b_{20}x^2 + b_{21}x^2y + b_{03}y^3 \tag{6}$$

Coefficients $a_{00}$, $a_{10}$, $a_{01}$, $a_{02}$, $a_{30}$, $a_{12}$, $b_{00}$, $b_{10}$, $b_{01}$, $b_{20}$, $b_{21}$, and $b_{03}$ in these equations can be determined if measurements in six sample shot areas or more are available. Specifically, using measurements $(X_i, Y_i)$, which are positional deviations, from the center position $(x_i, y_i)$ of one sample shot area from design, the coefficients are determined by solving the normal equations in the least squares approximation. The normal equations are typically solved using a known LU factorization method or iteration method.

$$\begin{bmatrix} \sum 1 & \sum x_i & \sum y_i & \sum y_i^2 & \sum x_i^3 & \sum x_iy_i^2 \\ \sum x_i & \sum x_i^2 & \sum x_iy_i & \sum x_iy_i^2 & \sum x_i^4 & \sum x_i^2y_i^2 \\ \sum y_i & \sum x_iy_i & \sum y_i^2 & \sum y_i^3 & \sum x_i^3y_i & \sum x_iy_i^3 \\ \sum y_i^2 & \sum x_iy_i^2 & \sum y_i^3 & \sum y_i^4 & \sum x_i^3y_i^2 & \sum x_iy_i^4 \\ \sum x_i^3 & \sum x_i^4 & \sum x_i^3y_i & \sum x_i^3y_i^2 & \sum x_i^6 & \sum x_i^4y_i^2 \\ \sum x_iy_i^2 & \sum x_i^2y_i^2 & \sum x_iy_i^3 & \sum x_iy_i^4 & \sum x_i^4y_i^2 & \sum x_i^2y_i^4 \end{bmatrix} \tag{7}$$

$$\begin{bmatrix} a_{00} \\ a_{10} \\ a_{01} \\ a_{02} \\ a_{30} \\ a_{12} \end{bmatrix} = \begin{bmatrix} \sum X_i \\ \sum X_ix_i \\ \sum X_iy_i \\ \sum X_iy_i^2 \\ \sum X_ix_i^3 \\ \sum X_ix_iy_i^2 \end{bmatrix}$$

-continued $$\begin{bmatrix} \sum 1 & \sum x_i & \sum y_i & \sum x_i^2 & \sum x_i^2 y_i & \sum y_i^3 \\ \sum x_i & \sum x_i^2 & \sum x_i y_i & \sum x_i^3 & \sum x_i^3 y_i & \sum x_i y_i^3 \\ \sum y_i & \sum x_i y_i & \sum y_i^2 & \sum x_i^2 y_i & \sum x_i^2 y_i^2 & \sum y_i^4 \\ \sum x_i^2 & \sum x_i^3 & \sum x_i^2 y_i & \sum x_i^4 & \sum x_i^4 y_i & \sum x_i^2 y_i^3 \\ \sum x_i^2 y_i & \sum x_i^3 y_i & \sum x_i^2 y_i^2 & \sum x_i^4 y_i & \sum x_i^4 y_i^2 & \sum x_i^2 y_i^4 \\ \sum y_i^3 & \sum x_i y_i^3 & \sum y_i^5 & \sum x_i^2 y_i^3 & \sum x_i^2 y_i^4 & \sum y_i^6 \end{bmatrix} \quad (8)$$

$$\begin{bmatrix} b_{00} \\ b_{10} \\ b_{01} \\ b_{20} \\ b_{21} \\ b_{03} \end{bmatrix} = \begin{bmatrix} \sum Y_i \\ \sum Y_i x_i \\ \sum Y_i y_i \\ \sum Y_i x_i^2 \\ \sum Y_i x_i^2 y_i \\ \sum Y_i y_i^3 \end{bmatrix}$$

The in-shot errors (including the shot rotation and shot magnification correction) and shift of each shot area are calculated from the magnification correction, rotation and shift of the entire wafer. In the first embodiment, the in-shot error is estimated on the assumption that the in-shot error for each shot area is assumed to be equal to a rate of change in positional deviation of each shot area position. Specifically, as expressed in the following equations, an X-direction shot magnification correction $M_x(x, y)$ is derived from a rate of change (i.e., a derivative) in an X-direction positional deviation with respect to the X direction, a Y-direction shot magnification correction $M_y(x, y)$ is derived from a rate of change (i.e., a derivative) in a Y-direction positional deviation with respect to the Y direction, an X-direction shot rotation $\theta_x(x, y)$ is derived from a rate of change (i.e., a derivative) in an X-direction positional deviation with respect to the Y direction, and a Y-direction shot rotation $\theta_y(x, y)$ is derived from a rate of change (i.e., a derivative) in a Y-direction positional deviation with respect to the X direction.

$$M_x(x, y) = \frac{dX(x, y)}{dx} \quad (9)$$

$$= a_{10} + 3a_{30}x^2 + a_{12}y^2 \quad (10)$$

$$M_y(x, y) = \frac{dY(x, y)}{dy} \quad (11)$$

$$= b_{01} + 3b_{21}x^2 + b_{03}y^2 \quad (12)$$

$$\theta_x(x, y) = \frac{dX(x, y)}{dy} \quad (13)$$

$$= a_{01} + 2a_{02}y + 2a_{12}xy \quad (14)$$

$$\theta_y(x, y) = \frac{dY(x, y)}{dx} \quad (15)$$

$$= b_{10} + 2b_{21}x + 2b_{03}xy \quad (16)$$

The method of calculating the in-shot errors (the shot rotation and shot magnification correction) and shift from the measurements of the center of each sample shot area have been discussed.

As discussed above, the in-shot errors (i.e., shot rotations $\theta_x$ and $\theta_y$ and shot magnification corrections $M_x$ and $M_y$) and shifts X and Y are calculated from the measurements of the center position of each shot area. By correcting alignment errors during exposure, highly accurate alignment is performed. Since these corrections are performed simply by measuring the center position of each shot area, the throughput of the apparatus is affected only marginally.

Second Embodiment

Figure 6:
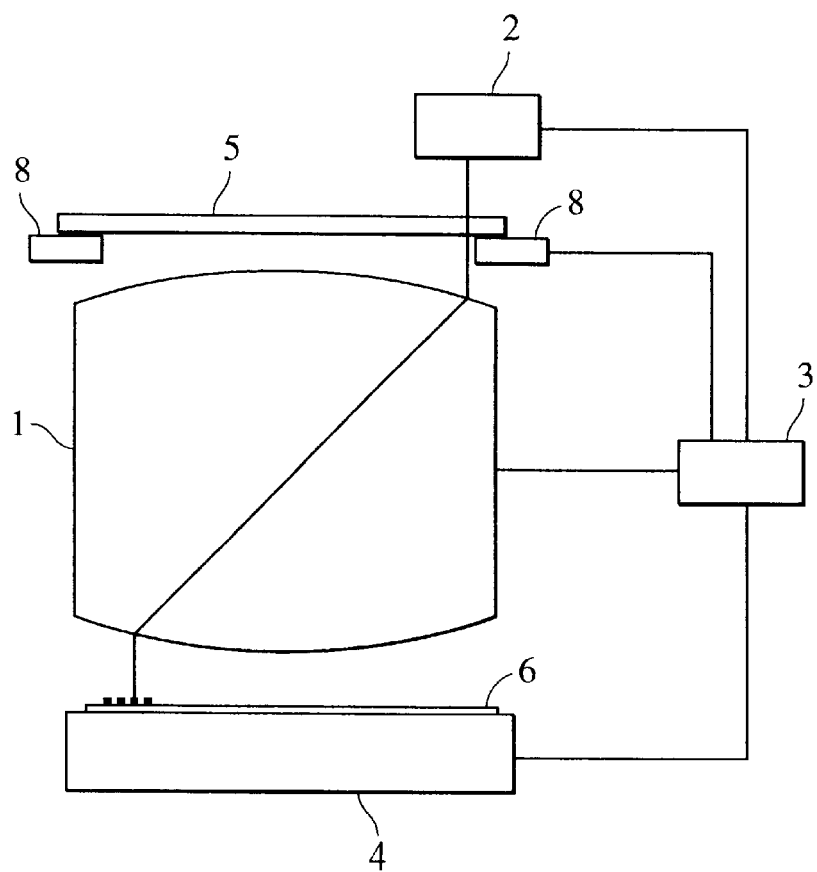
FIG. 6 shows a step-and-scan exposure apparatus for manufacturing semiconductor devices in accordance with a second embodiment of the present invention.

FIG. 6 shows a second embodiment of the present invention in which the second aspect of the present invention is implemented in a step-and-scan type exposure apparatus for manufacturing semiconductor devices.

Referring FIG. 6, the exposure apparatus includes a projection optical system 1, a mark position detector 2, a controller 3 for controlling the exposure apparatus, a two-dimensionally movable XY stage 4, a reticle (original mask) 5, a wafer (substrate) 6, and a reticle scan stage 8 for scan-moving the reticle 5. Although FIG. 6 shows only the X-direction mark position detector 2 for detecting a position in the X direction, the exposure apparatus also employs a Y-direction mark position detector (not shown) for detecting a position in the Y direction. The exposure apparatus for manufacturing semiconductor devices, as shown in FIG. 6, relatively aligns the reticle 5 and the wafer 6, projects exposure light from an illumination light source (not shown) onto the reticle 5, and exposes, in a step-and-scan manner, the wafer 6, placed onto the XY stage 4, to an electrical circuit pattern formed in the reticle 5, through the projection optical system 1. FIG. 3 shows an exposure field and sample shot areas, and FIG. 4 shows alignment marks in each sample shot area.

Figure 7:
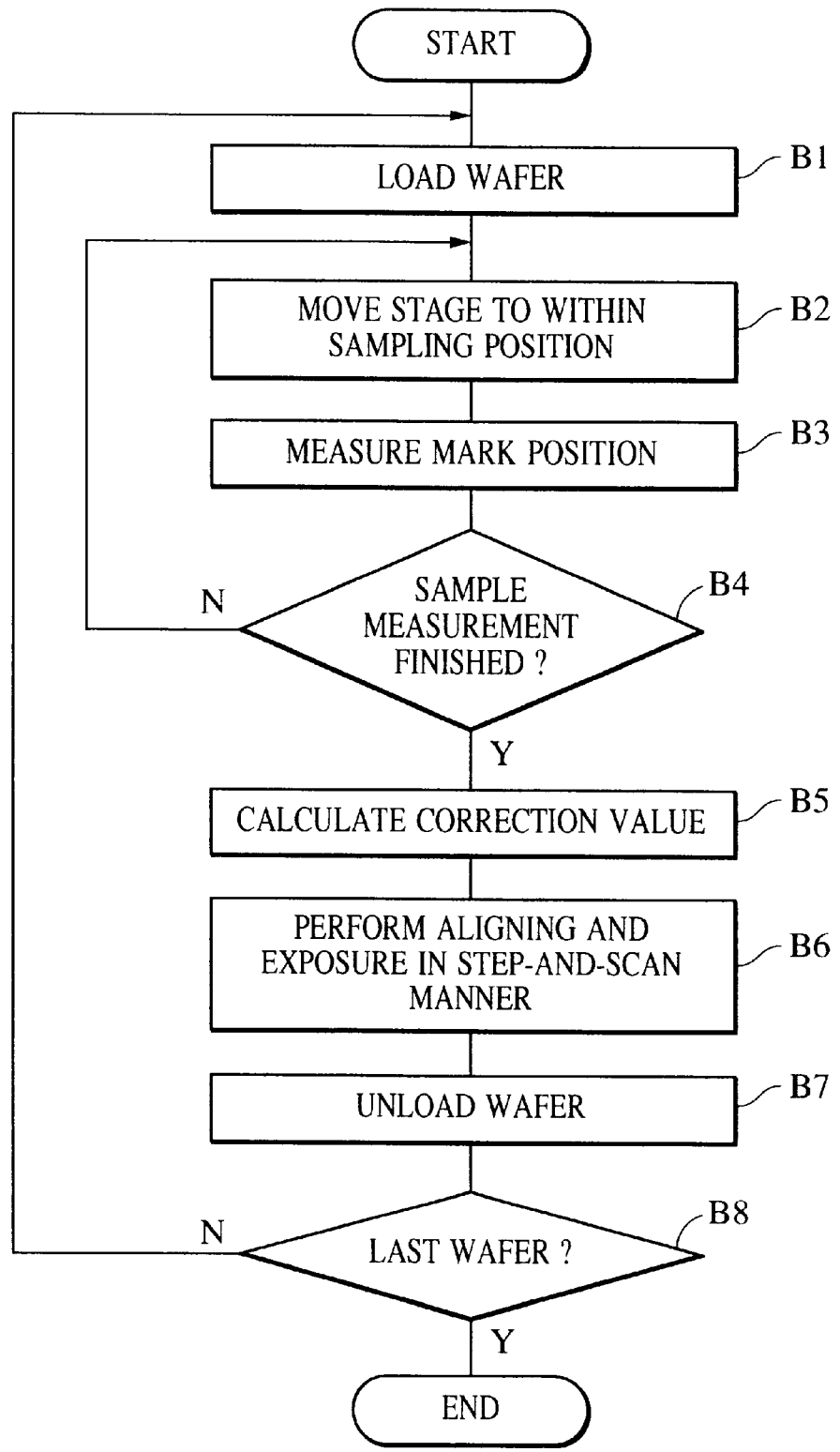
FIG. 7 is a flow diagram showing an alignment and exposure sequence used by the exposure apparatus of FIG. 6.

Now discussed is a procedure for the relative alignment between the reticle 5 and the wafer 6 and exposure of the wafer 6, using the exposure apparatus shown in FIG. 6. FIG. 7 is a flow diagram of the alignment and exposure sequence in which the present invention is implemented.

In step B1, a wafer transport mechanism (not shown) loads the wafer 6 onto the XY stage 4.

In step B2, the controller 3 drives the XY stage 4 until an alignment mark $L_x$, shown in FIG. 4, formed in a first sample shot area S1, shown in FIG. 3, comes within a field of view of the mark position detector 2.

In step B3, the position of the mark $L_x$ is measured in the following sequence.

An aligning illumination unit, in the mark position detector 2, for projecting non-exposure light, illuminates the alignment mark $L_x$ (also referred to as a wafer mark) through the projection optical system 1. FIG. 5 shows the wafer mark $L_x$, which is composed of a plurality of identical rectangles arranged side by side. A luminous flux, reflected off the wafer mark $L_x$, reaches the mark position detector 2 through the projection optical system 1. An image of the wafer mark $L_x$ is formed on an image pickup device included in the mark position detector 2.

The image pickup device photoelectrically converts the image of the wafer mark $L_x$, and an A/D converter converts the wafer image into a digital signal F(x). Pattern matching is performed using a prestored template, and the center of the mark is measured and is output to the controller 3. The center of the mark is determined with respect to the plane of the image pickup device, and the controller 3 calculates the positional deviation $X_1$ of the wafer mark $L_x$ with respect to the reticle 5 in accordance with a method (not shown), based on the position of the reticle 5 relative to the image pickup device.

Similarly, the positional deviation $Y_1$ of the alignment mark $L_y$ (also shown in FIG. 4) is calculated.

Parameters regarding the positional deviation in each sample shot area are measured in one position in each of the X and Y directions and the positional deviation is then calculated. Measurements may be performed in a plurality of positions in each of the X and Y directions to determine the positional deviation in each shot area.

Step B2 and step B3 are repeated until a predetermined number of shot measurements is performed in step B4, and positional deviations in the shots $X_2 \ldots X_n$, $Y_2 \ldots Y_n$ are thus calculated.

In step B5, in-shot errors (i.e., a shot rotation and an error in shot magnification) and a shift (i.e., a positional deviation) of each shot area are calculated from the positional deviation of the sample shot area measured at step B3 in accordance with the following sequence.

1. The magnification correction, rotation and shift of the entire wafer are calculated using approximate equations of a high degree with respect to a position on the wafer.
2. The magnification correction, rotation and shift of each shot area are calculated using the high-degree equation.

In step B6, each shot area is exposed in a step-and-scan manner. Each shot area is scanning exposed with the reticle scan stage 8 maintained in synchronization with the XY stage 4. Prior to exposure, the in-shot error component and the shift, calculated in step B6, are corrected using a combination of the following correction means to relatively align the wafer 6 and the reticle 5.

The correction means for correcting the in-shot error component and shift in the step-and-scan type exposure apparatus are listed below.

1. The shift in each shot area is corrected by driving the XY stage 4.
2. Projection magnification correction means for driving a floating lens (not shown), in the projection optical system 1, corrects the shot magnification in each shot area. For example, the method, disclosed in Japanese Patent No. 2516194, may be employed as the projection magnification correction means.
3. Relative rotation correction means for rotating the reticle stage 7 relative to the XY stage 4 corrects the shot rotation in each shot area.
4. Distortion correction means, in the projection optical system 1, for driving an lens (not shown) corrects the shot rotation in each shot area. A method, for correcting distortion in driving the lens, is disclosed in detail in Provisional Publication No. 10-242048, which is assigned to the same assignee of this invention.
5. Skew correction means for relatively adjusting the scanning directions of the reticle scan stage 8 and the XY stage 4 corrects the shot rotation of each shot area.
6. Distortion correction means for adjusting the scanning speed of the XY stage 4 corrects the shot magnification in the scanning direction of each shot area.

In step B7, the unshown wafer transport mechanism unloads the wafer 6 from the XY stage 4.

Steps B1 through B7 are repeated until it is determined in step B8 that last wafer has been processed.

The method of calculating the in-shot errors (including the shot rotation and shot magnification correction) and the shift (the positional deviation) of each shot area from the measurements of the sample shot areas remains the same as that in the first embodiment, and no further discussion is provided here.

As discussed above, the in-shot errors (the shot rotations and shot magnification corrections) and the shift are calculated from the measurements of the center position of each shot area. By correcting alignment errors during exposure, a highly accurate alignment is performed. Since these corrections are performed simply by measuring the center position of each shot area, the throughput of the apparatus is affected only marginally.

Third Embodiment

Figure 8:
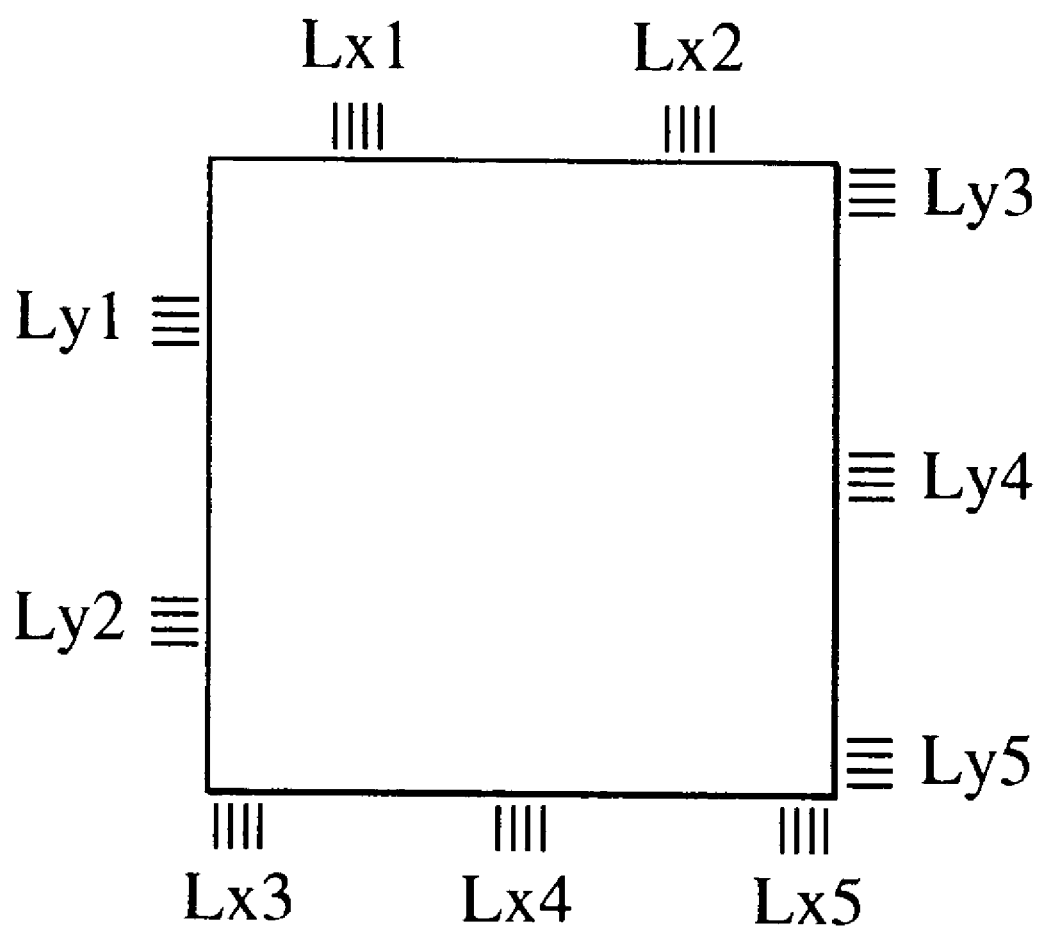
FIG. 8 shows alignment marks of a third embodiment and a fourth embodiment of the present invention.

In a third embodiment, the first aspect of the present invention is implemented in a step-and-repeat type exposure apparatus for manufacturing semiconductor devices. The third embodiment is identical to the first embodiment in the arrangement of the apparatus (see FIG. 1) and the general operation (see FIG. 2), although the difference therebetween lies in the layout of the alignment marks arranged in each shot area, the mark position measurement in step A3 and the calculation of correction in step A5 (in FIG. 2). FIG. 8 shows an example of alignment marks in each shot area in the wafer used in the third embodiment.

A procedure for the relative alignment between the reticle and the wafer 6 and exposure of the wafer 6 using the apparatus of the third embodiment (see FIG. 1) is discussed, referring to FIGS. 1, 2, 3, 5, and 8.

Referring to a flow diagram shown in FIG. 2, a wafer transport mechanism (not shown) loads the wafer 6 onto the XY stage 4 in step A1.

In step A2, the controller 3 drives the XY stage 4 until an alignment mark $L_{x1}$, shown in FIG. 8, formed in a first sample shot area S1, shown in FIG. 3, comes within a field of view of the mark position detector 2.

In step A3, the position of the mark $L_{x1}$ is measured in the following sequence.

An aligning illumination unit, in the mark position detector 2, for projecting non-exposure light, illuminates the alignment mark $L_{x1}$ (also referred to as a wafer mark) through the projection optical system 1. FIG. 5 shows the wafer mark $L_{x1}$, which is composed of a plurality of identical rectangles arranged side by side. A luminous flux, reflected off the wafer mark $L_{1x}$, reaches the mark position detector 2 through the projection optical system 1. An image N of the wafer mark $L_{x1}$ is formed on an image pickup device included in the mark position detector 2.

The image pickup device photoelectrically converts the image N of the wafer mark $L_{x1}$ and an A/D converter converts the wafer image N into a digital signal F(x). Pattern matching is performed using a prestored template, and the center of the mark is measured and is output to the controller 3. The center of the mark is determined with respect to the plane of the image pickup device, and the controller 3 calculates the positional deviation $X_{11}$ of the wafer mark $L_{x1}$ with respect to the reticle in accordance with a method (not shown), based on the position of the reticle 5 relative to the image pickup device.

A first measurement of a first sample shot area in the X direction thus ends. Similarly, positional deviations $X_{11} \ldots X_{1n}$, $Y_{11} \ldots Y_{1n}$, respectively, corresponding to alignment marks $L_{x2} \ldots L_{xn}$, $L_{y1} \ldots L_{ym}$, are measured.

Step A2 and step A3 are repeated until a predetermined number of shot measurements is performed in step A4, and positional deviations of the shot areas are thus stored.

In step A5, in-shot errors (i.e., a shot rotation and an error in shot magnification) and a shift (i.e., a positional deviation) of each shot area are calculated from the positional deviation measured at step A3 in accordance with the following sequence.

1. The in-shot error and shift of each sample shot area are calculated using a statistical technique as will be discussed later.
2. The in-shot error and shift of each shot area are calculated from the in-shot error and shift for each sample shot area.

In step A6, each shot area is exposed in a step-and-repeat manner. Prior to exposure, the in-shot error component and the shift, calculated in step A5, are corrected using a combination of the following correction means to relatively align the wafer 6 and the reticle 5.

The correction means of the in-shot error component and shift in the step-and-repeat type exposure apparatus are listed below.

1. The shift in each shot area is corrected by driving the XY stage 4.
2. Projection magnification correction means for driving a floating lens (not shown), in the projection optical system 1, corrects the shot magnification in each shot area. For example, the method, disclosed in Japanese Patent No. 2516194, may be employed as the projection magnification correction means.
3. Relative rotation correction means for rotating the reticle stage 7 relative to the XY stage 4 corrects the shot rotation in each shot area.
4. Distortion correction means, in the projection optical system 1, for driving an lens (not shown) corrects the shot rotation in each shot area. A method, for correcting distortion in driving the lens, is disclosed in detail in Provisional Publication No. 10-242048.

In step A7, the unshown wafer transport mechanism unloads the wafer 6 from the XY stage 4.

Steps A1 through A7 are repeated until it is determined in step A8 that the last wafer has been processed.

The alignment and exposure process of the present invention has been discussed.

The method of calculating in-shot errors (the shot rotation and shot magnification correction) of and the shift of each shot area from the measured values of the sample shot area is now discussed. In this embodiment, the in-shot error and shift of the sample shot area are calculated, and then the in-shot error and the shift of each shot area are calculated.

First, the method of calculating the in-shot error (the shot rotation and shot magnification correction) and the shift (positional deviation) of each sample shot area is discussed. The in-shot errors of a p-th sample shot, including an X-direction shot magnification correction $M_{xp}$ (a difference from a magnification of one), a Y-direction shot magnification correction $M_{yp}$ (a difference from a magnification of one), an X-direction shot rotation $\theta_{xp}$ (with a clockwise rotation set to be positive), a Y-direction shot rotation $\theta_{yp}$ (with a counterclockwise rotation set to be positive), an X-direction shift $S_{xp}$ of the shot area, and a Y-direction shift $S_{yp}$ of the shot area, are related using design positions $\alpha_{p1} \ldots \alpha_{pn}, \beta_{p1} \ldots \beta_{pm}$ as the centers of the marks treated and measured values of marks (positional deviations) of $X_{p1} \ldots X_{pn}, Y_{p1} \ldots Y_{pm}$ as in the following equations:

$$X_{p1} = M_{xp}\alpha_{p1} + \theta_{yp}\beta_{p1} + S_{xp}$$

$$X_{pn} = M_{xp}\alpha_{pn} + \theta_{yp}\beta_{pn} + S_{xp}$$

$$Y_{p1} = M_{yp}\beta_{p1} + \theta_{xp}\alpha_{p1} + S_{yp}$$

$$Y_{pm} = M_{yp}\beta_{pm} + \theta_{xp}\alpha_{pm} + S_{yp}$$

The above equations permit the in-shot errors and the shift to be determined if measurements are made at three or more points in each of the X and Y directions. When three points are set up in each of the X and Y directions, the following equations, derived from the above equations, determine the in-shot errors and the shift.

$$M_{xp} = \frac{A_1}{A_7}$$

$$M_{yp} = \frac{A_2}{A_8}$$

$$\theta_{xp} = \frac{A_3}{A_8}$$

$$\theta_{yp} = \frac{A_4}{A_7}$$

$$S_{xp} = \frac{A_5}{A_7}$$

$$S_{yp} = \frac{A_6}{A_8}$$

where $A_1 \ldots A_8$ are expressed by the following equations.

$$A_1 = (X_{p1} - X_{p2})(\beta_{p2} - \beta_{p3}) - (X_{p2} - X_{p3})(\beta_{p1} - \beta_{p2})$$

$$A_2 = (Y_{p1} - Y_{p2})(\alpha_{p2} - \alpha_{p3}) - (Y_{p2} - Y_{p3})(\alpha_{p1} - \alpha_{p2})$$

$$A_3 = (X_{p2} - X_{p3})(\alpha_{p1} - \alpha_{p2}) - (X_{p1} - X_{p2})(\alpha_{p2} - \beta_{p3})$$

$$A_4 = (Y_{p2} - Y_{p3})(\beta_{p1} - \beta_{p2}) - (Y_{p1} - Y_{p2})(\beta_{p2} - \beta_{p3})$$

$$A_5 = X_{p1}((\alpha_{p1} - \alpha_{p2})(\beta_{p2} - \beta_{p3}) - (\alpha_{p2} - \alpha_{p3})(\beta_{p1} - \beta_{p2})) -$$
$$\alpha_{p1}((X_{p1} - X_{p2})(\beta_{p2} - \beta_{p3}) - (X_{p2} - X_{p3})(\beta_{p1} - \beta_{p2})) +$$
$$\beta_{p1}((X_{p1} - X_{p2})(\alpha_{p2} - \alpha_{p3}) - (X_{p2} - X_{p3})(\alpha_{p1} - \alpha_{p2}))$$

$$A_6 = Y_{p1}((\beta_{p1} - \beta_{p2})(\alpha_{p2} - \alpha_{p3}) - (\beta_{p2} - \beta_{p3})(\alpha_{p1} - \alpha_{p2})) -$$
$$\beta_{p1}((Y_{p1} - Y_{p2})(\alpha_{p2} - \alpha_{p3}) - (Y_{p2} - Y_{p3})(\alpha_{p1} - \alpha_{p2})) +$$
$$\alpha_{p1}((Y_{p1} - Y_{p2})(\beta_{p2} - \beta_{p3}) - (Y_{p2} - Y_{p3})(\beta_{p1} - \beta_{p2}))$$

$$A_7 = (\alpha_{p1} - \alpha_{p2})(\beta_{p2} - \beta_{p3}) - (\alpha_{p2} - \alpha_{p3})(\beta_{p1} - \beta_{p2})$$

$$A_8 = (\beta_{p1} - \beta_{p2})(\alpha_{p2} - \alpha_{p3}) - (\beta_{p2} - \beta_{p3})(\alpha_{p1} - \alpha_{p2})$$

Also, when three points are set up in each of the X and Y directions, the least squares approximation is used to determine the in-shot errors and the shift.

$$S_{xp} = \frac{\begin{array}{c}B_{04}B_{06}B_{07} - B_{05}^2 B_{07} + B_{03}B_{05}B_{08} - \\ B_{02}B_{06}B_{08} + B_{02}B_{05}B_{09} - B_{03}B_{04}B_{09}\end{array}}{B_{13}}$$

$$M_{xp} = \frac{\begin{array}{c}B_{03}B_{05}B_{07} - B_{02}B_{06}B_{07} + B_{01}B_{06}B_{08} - \\ B_{03}^2 B_{08} + B_{02}B_{03}B_{09} - B_{01}B_{05}B_{09}\end{array}}{B_{13}}$$

$$\theta_{xp} = \frac{\begin{array}{c}B_{02}B_{05}B_{07} - B_{03}B_{04}B_{07} + B_{02}B_{03}B_{08} - \\ B_{01}B_{05}B_{08} + B_{01}B_{04}B_{09} - B_{02}^2 B_{09}\end{array}}{B_{13}}$$

$$S_{yp} = \frac{\begin{array}{c}B_{04}B_{06}B_{10} - B_{05}^2 B_{10} + B_{03}B_{05}B_{11} - \\ B_{02}B_{06}B_{11} + B_{02}B_{05}B_{12} - B_{03}B_{04}B_{12}\end{array}}{B_{13}}$$

$$M_{yp} = \frac{\begin{array}{c}B_{03}B_{05}B_{10} - B_{02}B_{06}B_{10} + B_{01}B_{06}B_{11} - \\ B_{03}^2 B_{11} + B_{02}B_{03}B_{12} - B_{01}B_{05}B_{12}\end{array}}{B_{13}}$$

$$\theta_{yp} = \frac{\begin{array}{c}B_{02}B_{05}B_{10} - B_{03}B_{04}B_{10} + B_{02}B_{03}B_{11} - \\ B_{01}B_{05}B_{11} + B_{01}B_{04}B_{02} - B_{02}^2 B_{12}\end{array}}{B_{13}}$$

where the following equations hold:

$B_{01} = \Sigma 1$ $B_{02} = \Sigma \alpha_{pi}$ $B_{03} = \Sigma \beta_{pi}$ $B_{04} = \Sigma \alpha_{pi}^2$ $B_{05} = \Sigma \alpha_{pi} \beta_{pi}$ $B_{06} = \Sigma \beta_{pi}^2$ $B_{07} = \Sigma X_{pi}$ $B_{08} = \Sigma \alpha_{pi} X_{pi}$ $B_{09} = \Sigma \beta_{pi} X_{pi}$ $B_{10} = \Sigma Y_{pi}$ $B_{11} = \Sigma \alpha_{pi} Y_{pi}$ $B_{12} = \Sigma \beta_{pi} Y_{pi}$ $B_{13} = B_{01}B_{04}B_{06} - B_{01}B_{05}^2 - B_{02}^2 B_{06} + 2B_{02}B_{03}B_{05} - B_{03}^2 B_{04}$ The more the measurement points, the more time that is required for measurement, although abnormal values are removed and an averaging effect is expected.

Discussed next is the method of statistically calculating the in-shot error components and the shift of each shot area from the in-shot errors (the shot rotation and the shot magnification correction) and the shift of the sample shot area. The in-shot error components of each shot are calculated based on the assumption that the in-shot error and the shift of each shot area in the wafer linearly vary. Specifically, the in-shot error components and shift of the shot area are expressed by the following equations, when the shot center position from design is (x, y) with the origin set at the center of the wafer.

$M_x(x,y) = a_{00} + a_{10}x + a_{01}y$ $M_y(x,y) = b_{00} + b_{10}x + b_{01}y$ $\theta_x(x,y) = c_{00} + c_{10}x + c_{01}y$ $\theta_y(x,y) = d_{00} + d_{10}x + d_{01}y$ $S_x(x,y) = e_{00} + e_{10}x + e_{01}y$ $S_y(x,y) = f_{00} + f_{10}x + f_{01}y$ where $a_{00}$, $a_{10}$, $a_{01}$, $b_{00}$, $b_{10}$, $b_{01}$, $c_{00}$, $c_{10}$, $c_{01}$, $d_{00}$, $d_{10}$, $d_{01}$, $e_{00}$, $e_{10}$, $e_{01}$, $f_{00}$, $f_{10}$, and $f_{01}$ are coefficients representing rates of change in the in-shot error components and shifts in the wafer. The above equations permit the coefficients to be determined if measurements are made at three or more points in each of the X and Y directions. When three points are set up in each of the X and Y directions, the following equations, derived from the above equations, determine the coefficients:

$$a_{00} = \frac{C_{01}}{C_{19}}, a_{10} = \frac{C_{02}}{C_{19}}, a_{01} = \frac{C_{03}}{C_{20}},$$

$$b_{00} = \frac{C_{04}}{C_{20}}, b_{10} = \frac{C_{05}}{C_{20}}, b_{01} = \frac{C_{06}}{C_{19}},$$

$$c_{00} = \frac{C_{07}}{C_{19}}, c_{10} = \frac{C_{08}}{C_{19}}, c_{01} = \frac{C_{09}}{C_{20}},$$

$$d_{00} = \frac{C_{10}}{C_{20}}, d_{10} = \frac{C_{11}}{C_{20}}, d_{01} = \frac{C_{12}}{C_{19}},$$

$$e_{00} = \frac{C_{13}}{C_{19}}, e_{10} = \frac{C_{14}}{C_{19}}, e_{01} = \frac{C_{15}}{C_{20}},$$

$$f_{00} = \frac{C_{16}}{C_{20}}, f_{10} = \frac{C_{17}}{C_{20}}, f_{01} = \frac{C_{18}}{C_{19}}$$

where $C_{01} \ldots C_{20}$ are expressed by the following equations when X and Y coordinates are $x_p(=x_1 \ldots x_3)$ and $y_p(=y_1 \ldots y_3)$ of the shot area center from design with the origin set to the center of the wafer:

$C_{01} = M_{x1}((x_1 - x_2)(y_2 - y_3) - (x_2 - x_3)(y_1 - y_2)) -$
$\quad x_1((M_{x1} - M_{x2})(y_2 - y_3) - (M_{x2} - M_{x3})(y_1 - y_2)) -$
$\quad y_1((M_{x1} - M_{x2})(x_2 - x_3) - (M_{x2} - M_{x3})(x_1 - x_2))$ $C_{02} = (M_{x1} - M_{x2})(y_2 - y_3) - (M_{x2} - M_{x3})(y_1 - y_2)$ $C_{03} = (M_{x2} - M_{x3})(x_1 - x_2) - (M_{x1} - M_{x2})(x_2 - x_3)$ $C_{04} = M_{y1}((y_1 - y_2)(x_2 - x_3) - (y_2 - y_3)(x_1 - x_2)) -$
$\quad y_1((M_{y1} - M_{y2})(x_2 - x_3) - (M_{y2} - M_{y3})(x_1 - x_2)) +$
$\quad x_1((M_{y1} - M_{y2})(y_2 - y_3) - (M_{y2} - M_{y3})(y_1 - y_2))$ $C_{05} = (M_{y1} - M_{y2})(x_2 - x_3) - (M_{y2} - M_{y3})(x_1 - x_2)$ $C_{06} = (M_{y2} - M_{y3})(y_1 - y_2) - (M_{y1} - M_{y2})(y_2 - y_3)$ $C_{07} = \theta_{x1}((x_1 - x_2)(y_2 - y_3) - (x_2 - x_3)(y_1 - y_2)) -$
$\quad x_1((\theta_{x1} - \theta_{x2})(y_2 - y_3) - (\theta_{x2} - \theta_{x3})(y_1 - y_2)) +$
$\quad y_1((\theta_{x1} - \theta_{x2})(x_2 - x_3) - (\theta_{x2} - \theta_{x3})(x_1 - x_2))$ $C_{08} = (\theta_{x1} - \theta_{x2})(y_2 - y_3) - (\theta_{x2} - \theta_{x3})(y_1 - y_2)$ $C_{09} = (\theta_{x2} - \theta_{x3})(x_1 - x_2) - (\theta_{x1} - \theta_{x2})(x_2 - x_3)$ $C_{10} = \theta_{y1}((y_1 - y_2)(x_2 - x_3) - (y_2 - y_3)(x_1 - x_2)) -$
$\quad y_1((\theta_{y1} - \theta_{y2})(x_2 - x_3) - (\theta_{y2} - \theta_{y3})(x_1 - x_2)) +$
$\quad x_1((\theta_{y1} - \theta_{y2})(y_2 - y_3) - (\theta_{y2} - \theta_{y3})(y_1 - y_2))$ $C_{11} = (\theta_{y1} - \theta_{y2})(x_2 - x_3) - (\theta_{y2} - \theta_{y3})(x_1 - x_2)$ $C_{12} = (\theta_{y2} - \theta_{y3})(y_1 - y_2)(\theta_{y1} - \theta_{y2})(y_2 - y_3)$ $C_{13} = S_{x1}((x_1 - x_2)(y_2 - y_3) - (x_2 - x_3)(y_1 - y_2)) -$
$\quad x_1((S_{x1} - S_{x2})(y_2 - y_3) - (S_{x2} - S_{x3})(y_1 - y_2)) -$
$\quad y_1((S_{x1} - S_{x2})(x_2 - x_3) - (S_{x2} - S_{x3})(x_1 - x_2))$ $C_{14} = (S_{x1} - S_{x2})(y_2 - y_3) - (S_{x2} - S_{x3})(y_1 - y_2)$ $C_{15} = (S_{x2} - S_{x3})(x_1 - x_2) - (S_{x1} - S_{x2})(x_2 - x_3)$ $C_{16} = S_{y1}((y_1 - y_2)(x_2 - x_3) - (y_2 - y_3)(x_1 - x_2)) -$ -continued $$y_1((S_{y1} - S_{y2})(x_2 - x_3) - (S_{y2} - S_{y3})(x_1 - x_2)) +$$
$$x_1((S_{y1} - S_{y2})(y_2 - y_3) - (S_{y2} - S_{y3})(y_1 - y_2))$$

$C_{17} = (S_{y1} - S_{y2})(x_2 - x_3) - (S_{y2} - S_{y3})(x_1 - x_2)$ $C_{18} = (S_{y2} - S_{y3})(y_1 - y_2) - (S_{y1} - S_{y2})(y_2 - y_3)$ $C_{19} = (x_1 - x_2)(y_2 - y_3) - (x_2 - x_3)(y_1 - y_2)$ $C_{20} = (y_1 - y_2)(x_2 - x_3) - (y_2 - y_3)(x_1 - x_2)$

Also, when three points are set up in each of the X and Y directions, the least squares approximation may be used to determine the coefficients using the following equations.

$$a_{00} = \frac{\begin{array}{c}D_{04}D_{06}D_{07} - D^2{}_{05}D_{07} + D_{03}D_{05}D_{08} - \\ D_{02}D_{06}D_{08} + D_{02}D_{05}D_{09} - D_{03}D_{04}D_{09}\end{array}}{D_{13}}$$

$$a_{10} = \frac{\begin{array}{c}D_{03}D_{05}D_{07} - D_{02}D_{06}D_{07} + D_{01}D_{06}D_{08} - \\ D^2{}_{03}D_{08} + D_{02}D_{03}D_{09} - D_{01}D_{05}D_{09}\end{array}}{D_{13}}$$

$$a_{01} = \frac{\begin{array}{c}D_{02}D_{05}D_{07} - D_{03}D_{04}D_{07} + D_{02}D_{03}D_{08} - \\ D_{01}D_{05}D_{08} + D_{01}D_{04}D_{09} - D^2{}_{02}D_{09}\end{array}}{D_{13}}$$

$$b_{00} = \frac{\begin{array}{c}D_{04}D_{06}D_{10} - D^2{}_{05}D_{10} + D_{03}D_{05}D_{11} - \\ D_{02}D_{06}D_{11} + D_{02}D_{05}D_{12} - D_{03}D_{04}D_{12}\end{array}}{D_{13}}$$

$$b_{10} = \frac{\begin{array}{c}D_{03}D_{05}D_{10} - D_{02}D_{06}D_{10} + D_{01}D_{06}D_{11} - \\ D^2{}_{03}D_{11} + D_{02}D_{03}D_{12} - D_{01}D_{05}D_{12}\end{array}}{D_{13}}$$

$$b_{01} = \frac{\begin{array}{c}D_{02}D_{05}D_{10} - D_{03}D_{04}D_{10} + D_{02}D_{03}D_{11} - \\ D_{01}D_{05}D_{11} + D_{01}D_{04}D_{12} - D^2{}_{02}D_{12}\end{array}}{D_{13}}$$

$$c_{00} = \frac{\begin{array}{c}E_{04}E_{06}E_{07} - E^2{}_{05}E_{07} + E_{03}E_{05}E_{08} - \\ E_{02}E_{06}E_{08} + E_{02}E_{05}E_{09} - E_{03}E_{04}E_{09}\end{array}}{E_{13}}$$

$$c_{10} = \frac{\begin{array}{c}E_{03}E_{05}E_{07} - E_{02}E_{06}E_{07} + E_{01}E_{06}E_{08} - \\ E^2{}_{03}E_{08} + E_{02}E_{03}E_{09} - E_{01}E_{05}E_{09}\end{array}}{E_{13}}$$

$$c_{01} = \frac{\begin{array}{c}E_{02}E_{05}E_{07} - E_{03}E_{04}E_{07} + E_{02}E_{03}E_{08} - \\ E_{01}E_{05}E_{08} + E_{01}E_{04}E_{09} - E^2{}_{02}E_{09}\end{array}}{E_{13}}$$

$$d_{00} = \frac{\begin{array}{c}E_{04}E_{06}E_{10} - E^2{}_{05}E_{10} + E_{03}E_{05}E_{11} - \\ E_{02}E_{06}E_{11} + E_{02}E_{05}E_{12} - E_{03}E_{04}E_{12}\end{array}}{E_{13}}$$

$$d_{10} = \frac{\begin{array}{c}E_{03}E_{05}E_{10} - E_{02}E_{06}E_{10} + E_{01}E_{06}E_{11} - \\ E^2{}_{03}E_{11} + E_{02}E_{03}E_{12} - E_{01}E_{05}E_{12}\end{array}}{E_{13}}$$

$$d_{01} = \frac{\begin{array}{c}E_{02}E_{05}E_{10} - E_{03}E_{04}E_{10} + E_{02}E_{03}E_{11} - \\ E_{01}E_{05}E_{11} + E_{01}E_{04}E_{12} - E^2{}_{02}E_{12}\end{array}}{E_{13}}$$

$$e_{00} = \frac{\begin{array}{c}F_{04}F_{06}F_{10} - F^2{}_{05}F_{10} + F_{03}F_{05}F_{11} - \\ F_{02}F_{06}F_{11} + F_{02}F_{05}F_{12} - F_{03}F_{04}F_{12}\end{array}}{F_{13}}$$

$$e_{10} = \frac{\begin{array}{c}F_{03}F_{05}F_{10} - F_{02}F_{06}F_{10} + F_{01}F_{06}F_{11} - \\ F^2{}_{03}F_{11} + F_{02}F_{03}F_{12} - F_{01}F_{05}F_{09}\end{array}}{F_{13}}$$

$$e_{01} = \frac{\begin{array}{c}F_{02}F_{05}F_{10} - F_{03}F_{04}F_{10} + F_{02}F_{03}F_{11} - \\ F_{01}F_{05}F_{11} + F_{01}F_{05}F_{12} - F^2{}_{02}F_{12}\end{array}}{F_{13}}$$

$$f_{00} = \frac{\begin{array}{c}F_{04}F_{06}F_{07} - F^2{}_{05}F_{07} + F_{03}F_{05}F_{08} - \\ F_{02}F_{06}F_{08} + F_{02}F_{05}F_{09} - F_{03}F_{04}F_{09}\end{array}}{F_{13}}$$

$$f_{10} = \frac{\begin{array}{c}F_{03}F_{05}F_{07} - F_{02}F_{06}F_{07} + F_{01}F_{06}F_{08} - \\ F^2{}_{03}F_{08} + F_{02}F_{03}F_{09} - F_{01}F_{05}F_{09}\end{array}}{F_{13}}$$

$$f_{01} = \frac{\begin{array}{c}F_{02}F_{05}F_{07} - F_{03}F_{04}F_{07} + F_{02}F_{03}F_{08} - \\ F_{01}F_{05}F_{08} + F_{01}F_{04}F_{09} - F^2{}_{02}F_{09}\end{array}}{F_{13}}$$

where $D_{01} = \Sigma 1$ $D_{02} = \Sigma x_i$ $D_{03} = \Sigma y_i$ $D_{04} = \Sigma x_i^2$ $D_{05} = \Sigma x_i y_i$ $D_{06} = \Sigma y_i^2$ $D_{07} = \Sigma M_{xi}$ $D_{08} = \Sigma x_i M_{xi}$ $D_{09} = \Sigma y_i M_{xi}$ $D_{10} = \Sigma M_{yi}$ $D_{11} = \Sigma x_i M_{yi}$ $D_{12} = \Sigma y_i M_{yi}$ $D_{13} = D_{01}D_{04}D_{06} - D_{01}D^2{}_{05} - D^2{}_{02}D_{06} + 2D_{02}D_{03}D_{05} - D^2{}_{03}D_{04}$ $E_{01} = \Sigma 1$ $E_{02} = \Sigma x_i$ $E_{03} = \Sigma y_i$ $E_{04} = \Sigma x_i^2$ $E_{05} = \Sigma x_i y_i$ $E_{06} = \Sigma y_i^2$ $E_{07} = \Sigma \theta_{xi}$ $E_{08} = \Sigma x_i \theta_{xi}$ $E_{09} = \Sigma y_i \theta_{xi}$ $E_{10} = \Sigma \theta_{yi}$ $E_{11} = \Sigma x_i \theta_{yi}$ $E_{12} = \Sigma y_i \theta_{yi}$ $E_{13} = E_{11}E_{14}E_{16} - E_{11}E^2{}_{15} - E^2{}_{12}E_{16} + 2E_{12}E_{13}E_{15} - E^2{}_{13}E_{14}$ $F_{01} = \Sigma 1$ $F_{02} = \Sigma x_i$ $F_{03}=\Sigma y_i$ $F_{04}=\Sigma x_i^2$ $F_{05}=\Sigma x_i y_i$ $F_{06}=\Sigma y_i^2$ $F_{07}=\Sigma S_{xi}$ $F_{08}=\Sigma x_i S_{xi}$ $F_{09}=\Sigma y_i S_{xi}$ $F_{10}=\Sigma S_{yi}$ $F_{11}=\Sigma x_i S_{yi}$ $F_{12}=\Sigma y_i S_{yi}$ $F_{13}=F_{11}F_{14}F_{16}-F_{11}F^2_{15}-F_{12}F_{16}+2F_{12}F_{13}F_{15}-F^2_{13}F_{14}$ The in-shot error component and the shift of each shot area are calculated using the coefficients and the equations. As already discussed, the more the measurement points, the more the abnormal values are removed and the more the averaging effect is expected.

As discussed above, positional errors in a plurality of points in the sample shot area are measured, the positional errors (in-shot error and shift) of each shot are estimated, and the alignment error is corrected during exposure. A more accurate alignment is thus performed using the exposure apparatus and the exposure method of the present invention.

In the third embodiment, the in-shot error and shift of the sample shot areas are calculated after the measurement of all sample shot areas. Alternatively, the calculation of the in-shot error and shift may be performed on already measured shot areas while other shot areas are measured.

Fourth Embodiment

In a fourth embodiment, the first aspect of the present invention is implemented in a step-and-scan type exposure apparatus for manufacturing semiconductor devices. The fourth embodiment is identical to the second embodiment in the arrangement of the apparatus (see FIG. 6) and the general operation (see FIG. 7), although the difference therebetween lies in the layout of the alignment marks arranged in each shot area, the mark position measurement in step B3 and the calculation of correction in step B5 (in FIG. 7). FIG. 8 shows an example of alignment marks in each shot area in the wafer used in the third embodiment.

A procedure for the relative alignment between the reticle and the wafer 6 and exposure of the wafer 6 using the apparatus of the fourth embodiment (see FIG. 6) is discussed, referring to FIGS. 3, 5, 6, 7, and 8.

Referring to FIG. 7, a wafer transport mechanism (not shown) loads the wafer 6 onto the XY stage 4 in step B1.

In step B2, the controller 3 drives the XY stage 4 until an alignment mark $L_{x1}$, shown in FIG. 8, formed in a first sample shot area S1, shown in FIG. 3, comes within a field of view of the mark position detector 2.

In step B3, the position of the mark $L_x$ is measured in the following sequence.

An aligning illumination unit, in the mark position detector 2, for projecting non-exposure light, illuminates the alignment mark $L_{x1}$ (also referred to as a wafer mark) through the projection optical system 1. FIG. 5 shows the wafer mark $L_{x1}$, which is composed of a plurality of identical rectangles arranged side by side. A luminous flux, reflected off the wafer mark $L_{1x}$, reaches the mark position detector 2 through the projection optical system 1. An image of the wafer mark $L_{x1}$ is formed on an image pickup device included in the mark position detector 2.

The image pickup device photoelectrically converts the image of the wafer mark $L_{x1}$ and an A/D converter converts the wafer image into a digital signal F(x). Pattern matching is performed using a prestored template, and the center of the mark is measured and is output to the controller 3. The center of the mark is determined with respect to the plane of the image pickup device, and the controller 3 calculates the positional deviation $X_{11}$ of the wafer mark $L_{x1}$ with respect to the reticle 5 in accordance with a method (not shown), based on the position of the reticle 5 relative to the image pickup device.

A first measurement of a first sample shot area in the X direction thus ends. Similarly, positional deviations $X_{11} \ldots X_{1n}$, $Y_{11} \ldots Y_{1m}$, respectively corresponding to alignment marks $L_{x2} \ldots L_{xn}$, $L_{y1} \ldots L_{ym}$, are measured.

Step B2 and step B3 are repeated until a predetermined number of shot measurements is performed in step B4, and positional deviations of the sample shot areas are stored.

In step B5, the in-shot errors (the shot rotation and shot magnification) and the shift (the positional deviation) of each shot area are calculated from the positional deviation of each sample shot area measured at step B3 in accordance with the following sequence.

1. The in-shot error and shift of each sample shot area are calculated using the statistical technique discussed in connection with the first embodiment.

2. The in-shot error and shift of each shot area are calculated from the in-shot error and shift of the sample shot area using the statistical technique discussed in connection with the first embodiment.

In step B6, each shot area is exposed in a step-and-scan manner. Each shot area is scanning exposed with the reticle scan stage 8 maintained in synchronization with the XY stage 4. Prior to exposure, the in-shot error component and the shift, calculated in step B6, are corrected using a combination of the following correction means to relatively align the wafer 6 and the reticle 5.

The correction means of the in-shot error component and shift in the step-and-scan type exposure apparatus are listed below.

1. The shift in each shot area is corrected by driving the XY stage 4.

2. Projection magnification correction means for driving a floating lens (not shown), in the projection optical system 1, corrects the shot magnification in each shot area. For example, the method, disclosed in Japanese Patent No. 2516194, may be employed as the projection magnification correction means.

3. Relative rotation correction means for rotating the reticle stage 7 relative to the XY stage 4 corrects the shot rotation in each shot area.

4. Distortion correction means, in the projection optical system 1, for driving a lens (not shown) corrects the shot rotation in each shot area. A method, for correcting a distortion driving the lens, is disclosed in detail in Provisional Publication No. 10-242048, which is assigned to the same assignee of this invention.

5. Skew correction means for relatively adjusting the scanning directions of the reticle scan stage 8 and the XY stage 4 corrects the shot rotation of each shot area.

6. Distortion correction means for adjusting the scanning speed of the XY stage 4 corrects the shot magnification in the scanning direction of each shot area.

In step B7, the unshown wafer transport mechanism unloads the wafer 6 from the XY stage 4.

Steps B1 through B7 are repeated until it is determined in step B8 that the last wafer has been processed.

The method of calculating the in-shot errors (including the shot rotation and shot magnification correction) and the shift (the positional deviation) of each shot area from the measurements of the sample shots remains the same as that in the first embodiment, and no further discussion is provided here.

As discussed above, positional errors in a plurality of points in the sample shot area are measured, the positional errors (in-shot error and shift) of each shot area are estimated, and the alignment error is corrected during exposure. A more accurate alignment is thus performed using the exposure apparatus and the exposure method of the present invention.

In this embodiment, the in-shot error and shift of the sample shot area are calculated after the measurement of all sample shot areas. Alternatively, the calculation of the in-shot error and shift may be performed on already measured shot areas while other shot areas are measured.

Discussed next is an embodiment for manufacturing devices based on the exposure apparatus and the exposure method, described above.

Figure 9:
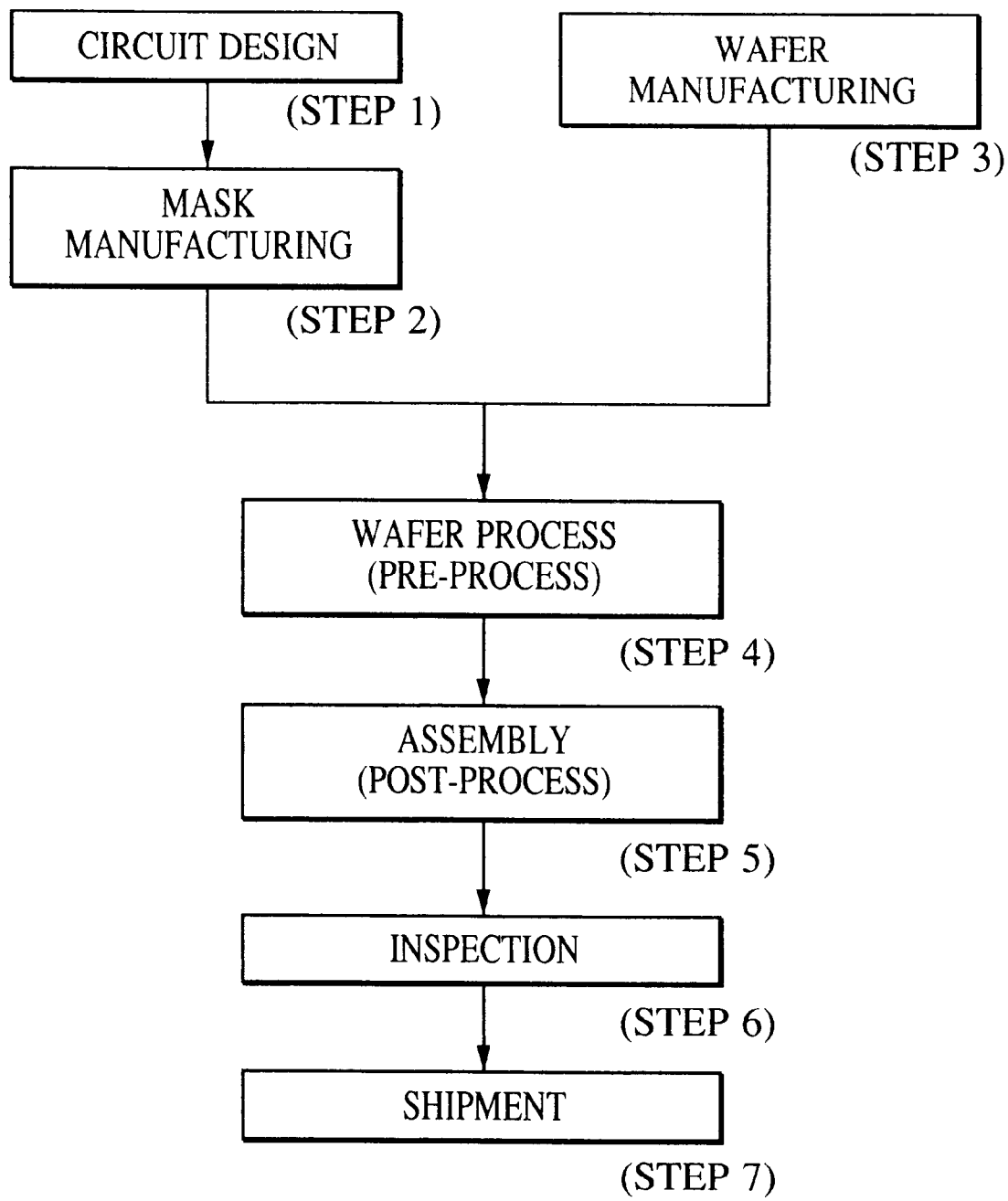
FIG. 9 shows a process flow diagram for manufacturing a miniature device.

FIG. 9 shows a process flow diagram for manufacturing micro devices (e.g., semiconductor chips such as integrated circuits and large-scale integrated circuits, liquid-crystal panels, charge-coupled devices, thin-film magnetic heads, and micro-machines). In step 1 (circuit design), a circuit of a semiconductor device is designed. In step 2 (mask manufacturing), a mask of the designed circuit pattern is manufactured. In step 3 (wafer manufacturing), a wafer is manufactured using a material such as silicon or glass. Step 4 (wafer process) is called a pre-process, and forms an actual circuit on the wafer using the so prepared mask and the wafer through lithographic techniques. Step 5 (assembly) is called a post-process, and produces a semiconductor chip from the wafer manufactured in step 4. Step 5 includes an assembly step (dicing and bonding), and a packaging step (chip encapsulating). Instep 6 (inspection), operation tests and endurance tests are conducted on the semiconductor device manufactured in step 5. After undergoing these steps, the semiconductor device is completed and shipped (step 7).

Figure 10:
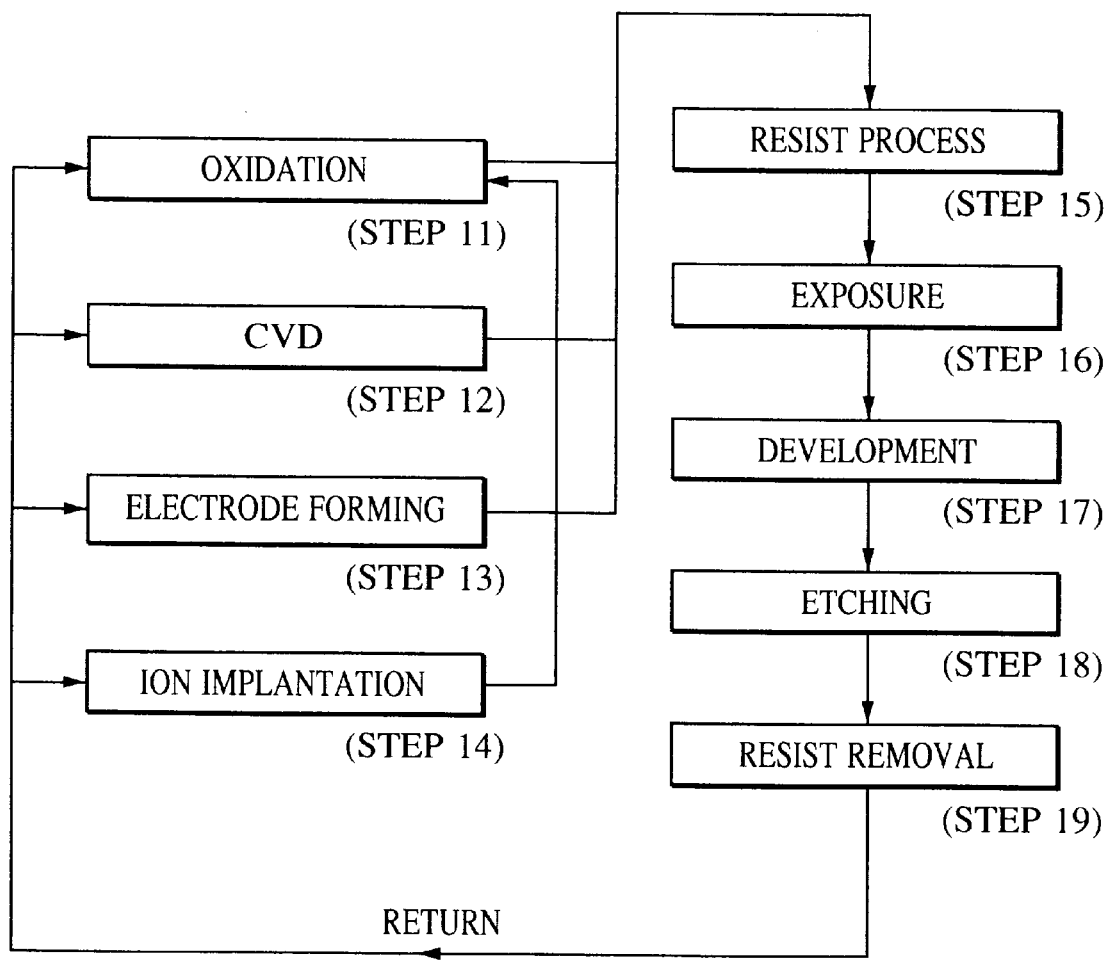
FIG. 10 is a detailed flow diagram of the wafer process in the process flow diagram of FIG. 9.

FIG. 10 is a detailed flow diagram of the wafer process. In step 11 (oxidation), the surface of the wafer is oxidized. In step 12 (chemical vapor deposition—CVD), an insulating film is formed on the wafer surface. In step 13 (electrode forming), an electrode is deposited on the wafer. In step 14 (ion implantation), ions are implanted to the wafer. In step 15 (resist process), a photosensitive agent is applied on the wafer. In step 16 (exposure), a plurality of shot areas on the wafer is exposed to the circuit pattern of a mask through multiple exposures by an exposure apparatus that performs alignment and exposure in accordance with the above-referenced methods. In step 17 (development), the exposed wafer is subjected to a development process. In step 18 (etching), a portion other than the developed resist image is etched away. In step 19 (resist removal), a resist, no longer required after etching, is removed. The circuit pattern is formed in a multi-layered fashion on the wafer after undergoing the repetition of these steps.

The manufacturing methods of the above embodiments thus permit, to be easily manufactured at a high yield, at a low cost, a semiconductor device having a high degree of integration, which was conventionally difficult to manufacture.

In accordance with the first aspect of the present invention, an accurate alignment is performed by correcting the in-shot error of each shot area. By statistically processing the measured values, abnormal values are removed and an averaging effect is provided. Thus, the accuracy of correction is substantially increased. The measurement of a sample shot area only corrects the in-shot error component at an accuracy level as good as, and outperforms in throughput, the case in which the in-shot error is measured at each shot area.

In accordance with the second aspect of the present invention, the positional deviation in each area is approximated by an equation of a higher order, and the in-shot error in each shot area is estimated from the equation. Thus, an accurate alignment in the exposure operation is provided. By statistically processing the measured values, abnormal values are removed and an averaging effect is provided. Thus, the accuracy of correction is increased to be almost the same level as that of the first aspect. Since the method of the second aspect corrects the in-shot error component with the measurement of a minimum number of sample shot areas, it outperforms the method of the first aspect and performs as good as the conventional method in terms of throughput.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus for exposing a substrate to transfer a pattern of an original mask to the substrate, said exposure apparatus comprising:

detecting means for detecting a position of a representative point within a representative area in the substrate;

determining means for determining the positional deviation of each of a plurality of the representative areas from among a plurality of areas in the substrate, based on the detection by said detecting means;

statistical calculation means for statistically calculating the positional deviation of each area in the substrate, based on the determined positional deviations of the representative areas;

calculating means for calculating an in-area error in each area, based on the statistically calculated positional deviation of each area; and correcting means for correcting the position of the substrate in accordance with the calculated in-area error, to successively process the areas of the substrate.

2. An exposure apparatus according to claim 1, wherein said statistical calculation means calculates the positional deviation of each area in the substrate by employing an approximation equation of a second or higher degree.

3. An exposure apparatus according to claim 1, wherein said calculating means calculates the in-area error, based on a rate of change in the positional deviation of each area.

4. An exposure apparatus according to claim 1, wherein the in-area error includes at least one of a magnification component and a rotational component.

5. An exposure apparatus according to claim 1, wherein said exposure apparatus is of a step-and-repeat type, which stepwise moves a substrate stage holding the substrate thereon to set an area of the substrate to an exposure position before exposing the area of the substrate, and said correcting means drives the substrate stage, an original mask stage holding the original mask thereon, or part of a projection lens unit during the stepwise movement to correct the in-area error of the area to be exposed.

6. An exposure apparatus according to claim 1, wherein said exposure apparatus is of a step-and-scan type, which stepwise moves a substrate stage holding the substrate thereon to set an area of the substrate to an exposure start position before exposing the substrate in a scanning exposure manner, and said correcting means drives the substrate stage, an original mask stage holding the original mask thereon, or part of a projection lens unit during the stepwise movement or scanning exposure operation to correct the in-area error of the area to be exposed.

7. An exposure apparatus according to claim 6, wherein the in-area error includes a skew component.

8. An exposure method for exposing a substrate to transfer a pattern of an original mask to the substrate, said method comprising the steps of:

detecting a position of a representative point within a representative area in the substrate;

determining the positional deviation of each of a plurality of the representative areas from among a plurality of areas in the substrate, based on the detection in said detecting step;

statistically calculating the positional deviation of each area in the substrate, based on the determined positional deviations of the representative areas;

calculating an in-area error in each area, based on the statistically calculated positional deviation of each area; and correcting the position of the substrate in accordance with the in-area error, to successively process the areas of the substrate.

9. An exposure method according to claim 8, wherein said step of statistically calculating the positional deviation calculates the positional deviation of each area in the substrate employing an approximation equation of a second or higher degree.

10. A device manufacturing method for manufacturing a device through exposing a substrate to transfer a pattern of an original mask to the substrate and through a development process, said device manufacturing method comprising the steps of:

detecting a position of a representative point within a representative area in the substrate;

determining the positional deviation of each of a plurality of the representative areas from among a plurality of areas in the substrate, based on the detection in said detecting step;

statistically calculating the positional deviation of each area in the substrate, based on the determined positional deviations of the representative areas;

calculating an in-area error in each area, based on the statistically calculated positional deviation of each area; and correcting the position of the substrate in accordance with the in-area error, to successively process the areas of the substrate.

11. An exposure apparatus for exposing a substrate to transfer a pattern of an original mask to the substrate, said exposure apparatus comprising:

detecting means for detecting a position of a representative point within a representative area from among a plurality of areas in the substrate, to determine an in-area error in the representative area;

statistical calculation means for statistically calculating the in-area error of each area in the substrate, based on the determined in-area errors of the representative areas; and correcting means for correcting the position of the substrate in accordance with the calculated in-area error, to successively process the areas of the substrate.

12. An exposure apparatus according to claim 11, wherein a plurality of representative points are set up in one representative area, said detecting means comprises measuring means for measuring the positional deviation in each of the plurality of representative points, and the in-area error of the representative area is determined based on the measured value of the positional deviation.

13. An exposure apparatus according to claim 11, wherein a plurality of representative areas are set up, and said statistical calculation means determines the in-area error of each area in the substrate, based on the in-area error determined for each representative area.

14. An exposure apparatus according to claim 13, wherein at least three representative areas are set up in the substrate.

15. An exposure apparatus according to claim 11, wherein the in-area error includes at least one of a magnification component and a rotational component.

16. An exposure apparatus according to claim 11, wherein said exposure apparatus is of a step-and-repeat type, which stepwise moves a substrate stage holding the substrate thereon to set an area of the substrate to an exposure position before exposing the area of the substrate, and said correcting means drives the substrate stage, an original mask stage holding the original mask thereon, or part of a projection lens unit during the stepwise movement to correct the in-area error of the area to be exposed.

17. An exposure apparatus according to claim 11, wherein said exposure apparatus is of a step-and-scan type, which stepwise moves a substrate stage holding the substrate thereon to set an area of the substrate to an exposure start position before exposing the substrate in a scanning exposure manner, and said correcting means drives the substrate stage, an original mask stage holding the original mask thereon, or part of a projection lens unit during the stepwise movement or scanning exposure operation to correct the in-area error of the area to be exposed.

18. An exposure apparatus according to claim 17, wherein the in-area error includes a skew component.

19. An exposure method for exposing a substrate to transfer a pattern of an original mask to the substrate, said method comprising the steps of:

detecting a position of a representative point within a representative area from among a plurality of areas in the substrate, to determine an in-area error of the representative area;

statistically calculating the in-area error of each area in the substrate, based on the determined in-area errors of the representative areas; and correcting the position of the substrate in accordance with the calculated in-area error, to successively process the areas of the substrate.

20. A device manufacturing method for manufacturing a device through exposing a substrate to transfer a pattern of an original mask to the substrate and through a development process, said device manufacturing method comprising the steps of:

detecting a position of a representative point within a representative area from among a plurality of areas in the substrate, to determine an in-area error of the representative area;

statistically calculating the in-area error of each area in the substrate, based on the determined in-area errors of the representative areas; and correcting the position of the substrate in accordance with the calculated in-area error, to successively process the areas of the substrate.

* * * * *

UNITED STATES PATENT AND TRADEMARK OFFICE
CERTIFICATE OF CORRECTION

PATENT NO. : 6,342,703 B1
DATED : January 29, 2002
INVENTOR(S) : Shinichiro Koga et al.

It is certified that error appears in the above-identified patent and that said Letters Patent is hereby corrected as shown below:

Column 7,
Line 10, "AID" should read -- A/D --.
Line 62, "an" should read -- a --.

Column 10,
Line 11, "Referring" should read -- Referring to --.

Column 13,
Line 19, "an" should read -- a --.

Column 15,
Line 6, "$B_{04=\Sigma\alpha pi}{}^2$" should read -- $B_{04}=\Sigma\alpha_{pi}{}^2$ --.

Column 16,
Line 21, "$(Y_2-Y_3)$-" should read -- $(y_2-y_3)$- --.

Column 18,
Line 3, "$F^2{}_{03}F_{11} + F_{02}F_{03}F_{12} - F_{01}F_{05}F_{09}$" should read -- $F^2{}_{03}F_{11} + F_{02}F_{03}E_{12} - F_{01}F_{05}F_{12}$ --.
Line 41, "$2D_{02D03}D_{05}$" should read -- $2D_{02}D_{03}D_{05}$ --.

Column 21,
Line 37, "Instep" should read -- In step --.

Signed and Sealed this

Seventh Day of October, 2003

JAMES E. ROGAN
*Director of the United States Patent and Trademark Office*